(12) United States Patent
Shionoiri et al.

(10) Patent No.: US 7,750,403 B2
(45) Date of Patent: Jul. 6, 2010

(54) SEMICONDUCTOR DEVICE AND MANUFACTURING METHOD THEREOF

(75) Inventors: Yutaka Shionoiri, Isehara (JP); Takuro Ohmaru, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 70 days.

(21) Appl. No.: 11/812,534

(22) Filed: Jun. 19, 2007

(65) Prior Publication Data

US 2008/0001228 A1    Jan. 3, 2008

(30) Foreign Application Priority Data

Jun. 30, 2006    (JP) ............................. 2006-181374

(51) Int. Cl.
*H01L 29/786* (2006.01)
(52) U.S. Cl. ................... 257/347; 257/350; 257/357; 257/E29.039
(58) Field of Classification Search ................ 257/347, 257/350, 357, 390, 391, E27.108, E29.039, 257/E29.116, E29.117
See application file for complete search history.

(56) References Cited

U.S. PATENT DOCUMENTS

| | | | |
|---|---|---|---|
| 5,297,029 A | 3/1994 | Nakai et al. | |
| 5,406,521 A | 4/1995 | Hara | |
| 5,428,568 A | 6/1995 | Kobayashi et al. | |
| 5,488,384 A | 1/1996 | Uehara et al. | |
| 5,592,430 A | 1/1997 | Ohtsuki | |
| 5,638,323 A | 6/1997 | Itano | |
| 5,828,612 A | 10/1998 | Yu et al. | |
| 6,160,733 A | 12/2000 | Ebel | |
| 6,339,549 B1 | 1/2002 | Jinbo et al. | |
| 6,587,392 B2 | 7/2003 | Ooishi | |
| 6,667,921 B2 | 12/2003 | Park | |
| 6,741,487 B2 | 5/2004 | Yokozeki | |
| 6,848,620 B2 | 2/2005 | Nakane et al. | |
| 6,856,563 B2 | 2/2005 | Kim et al. | |
| 6,934,842 B2 | 8/2005 | Okamoto et al. | |
| 7,130,234 B2 | 10/2006 | Shionoiri et al. | |
| 7,178,026 B2 | 2/2007 | Okamoto et al. | |

(Continued)

FOREIGN PATENT DOCUMENTS

JP    05-166381    7/1993

(Continued)

*Primary Examiner*—Sue Purvis
*Assistant Examiner*—Leslie Pilar Cruz
(74) *Attorney, Agent, or Firm*—Eric J. Robinson; Robinson Intellectual Property Law Office, P.C.

(57) ABSTRACT

An individual identifier is easily provided in a semiconductor device capable of wireless communication. The semiconductor device includes a thin film transistor including a channel forming region, an island-like semiconductor film including a source region and a drain region, a gate insulating film, and a gate electrode; an interlayer insulating film; a plurality of contact holes formed in the interlayer insulating film which reach one of the source region and the drain region; and a single contact hole which reaches the other of the source region and the drain region, wherein a diameter of the single contact hole is larger than a diameter of each of the plurality of contact holes, and a sum of areas of bases of the plurality of contact holes is equal to an area of a base of the single contact hole.

9 Claims, 24 Drawing Sheets

U.S. PATENT DOCUMENTS

| | | |
|---|---|---|
| 2001/0030323 A1 | 10/2001 | Ikeda |
| 2002/0003956 A1 | 1/2002 | Inagaki |
| 2002/0007325 A1 | 1/2002 | Tomon |
| 2003/0117842 A1 | 6/2003 | Hanazawa et al. |
| 2003/0169149 A1 | 9/2003 | Ohki et al. |
| 2004/0080986 A1 | 4/2004 | Hanazawa et al. |
| 2004/0115906 A1* | 6/2004 | Makita et al. ............... 438/486 |
| 2004/0241924 A1* | 12/2004 | Chen et al. ................. 438/197 |
| 2005/0045729 A1 | 3/2005 | Yamazaki |
| 2005/0047266 A1 | 3/2005 | Shinoiri et al. |
| 2005/0135181 A1 | 6/2005 | Shinoiri et al. |
| 2006/0175648 A1* | 8/2006 | Asami ....................... 257/296 |
| 2007/0007342 A1* | 1/2007 | Cleeves et al. ............. 235/435 |
| 2007/0064511 A1 | 3/2007 | Shionoiri et al. |

FOREIGN PATENT DOCUMENTS

| | | |
|---|---|---|
| JP | 06-020484 | 1/1994 |
| JP | 07-065594 | 3/1995 |
| JP | 09-147555 | 6/1997 |
| JP | 10-095189 | 4/1998 |
| JP | 10-145987 | 5/1998 |
| JP | 11-086555 | 3/1999 |
| JP | 11-203867 | 7/1999 |
| JP | 2000-348152 | 12/2000 |
| JP | 2001-101888 | 4/2001 |
| JP | 2001-143473 | 5/2001 |
| JP | 2002-319007 | 10/2002 |
| JP | 3578057 | 10/2004 |
| JP | 2006-351005 | 11/2006 |
| WO | WO-2006/123826 | 11/2006 |

* cited by examiner

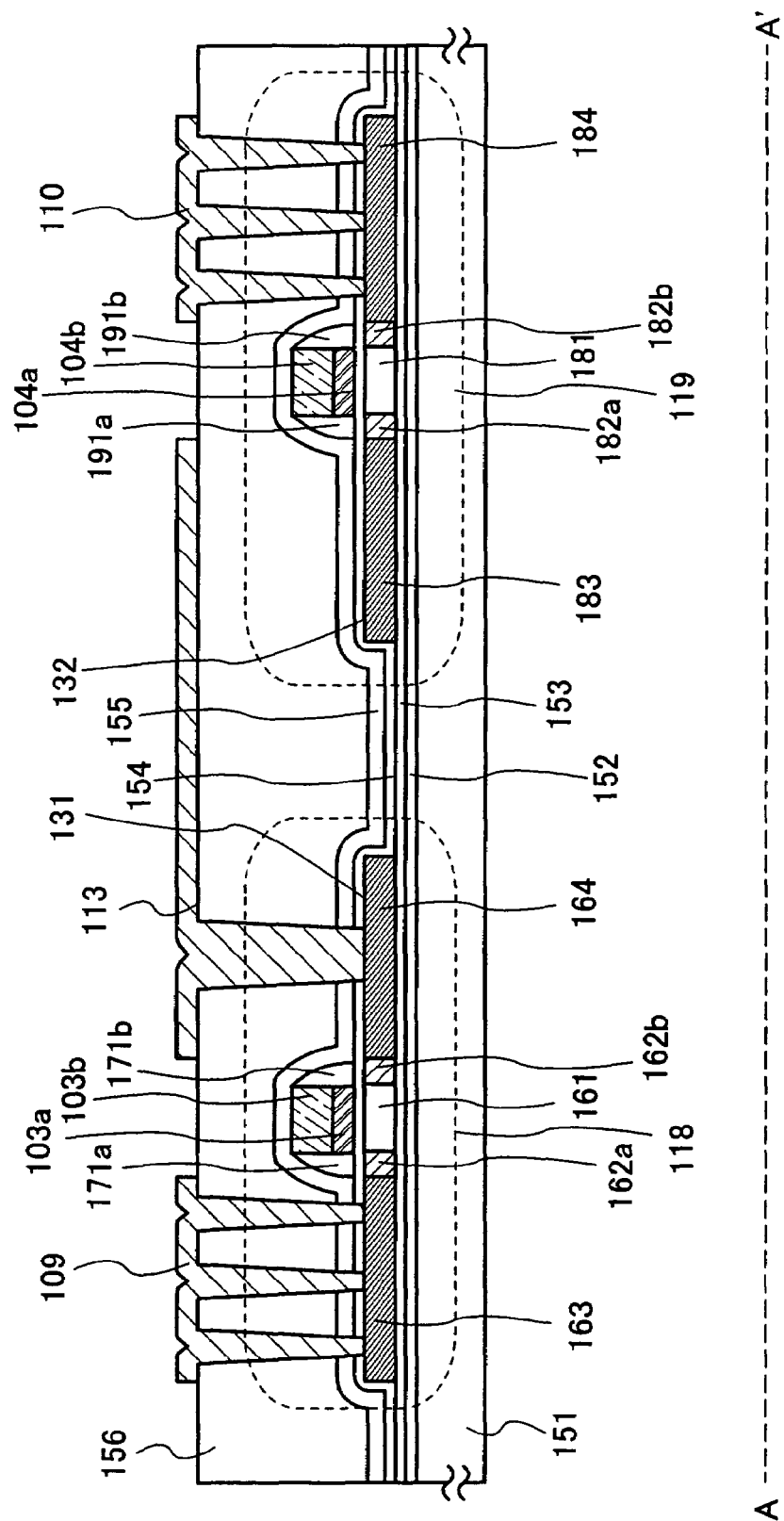

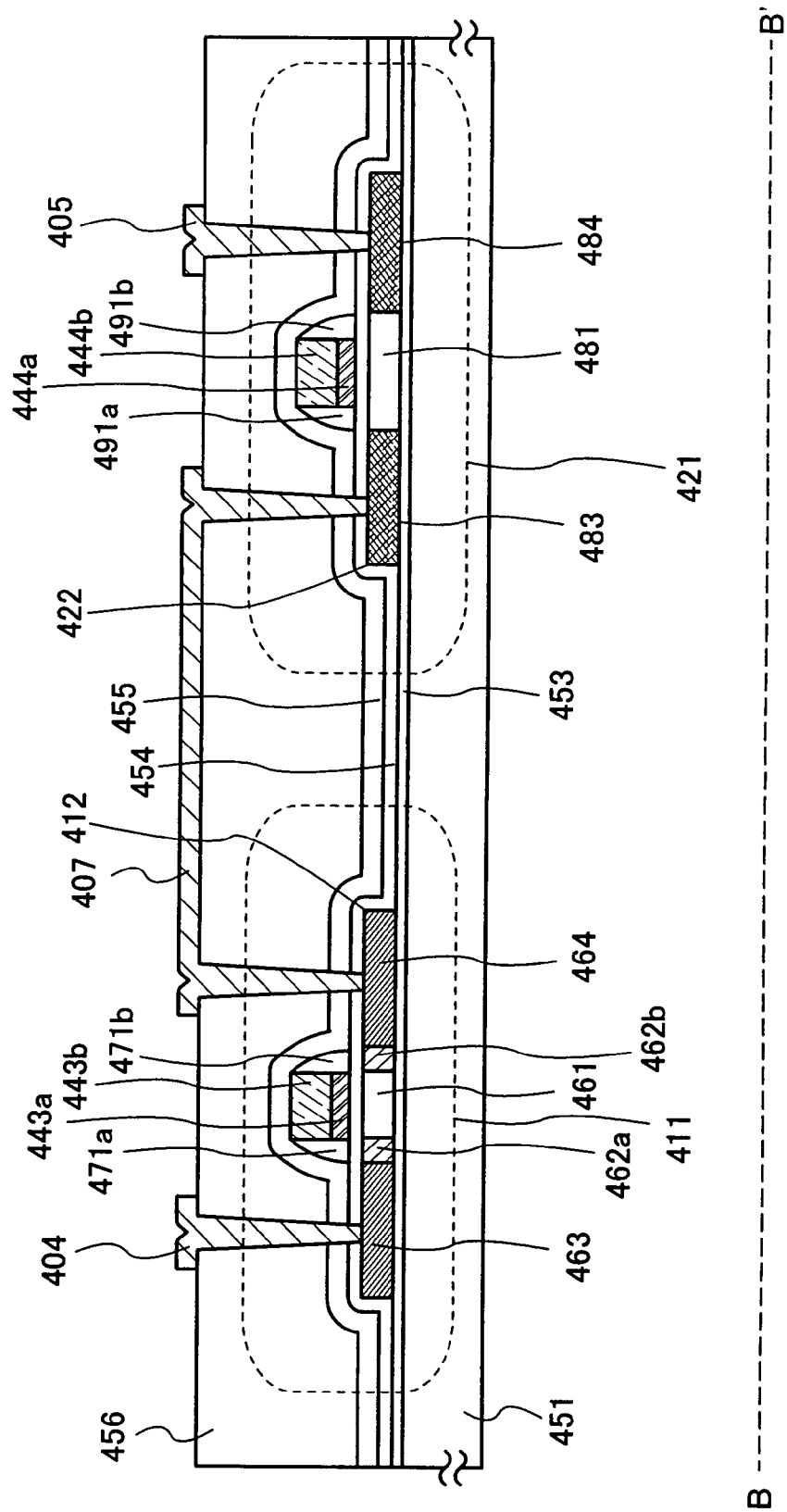

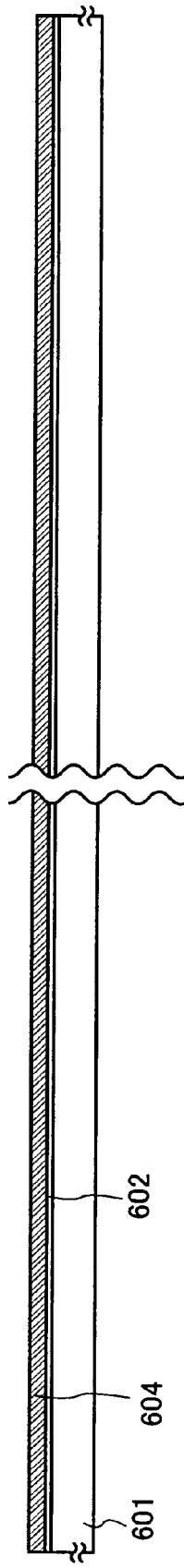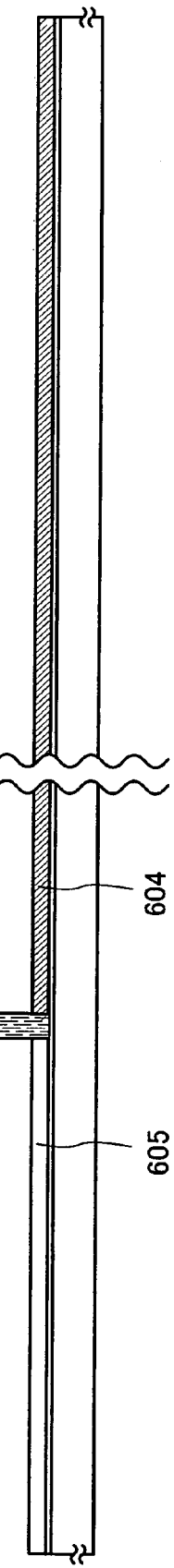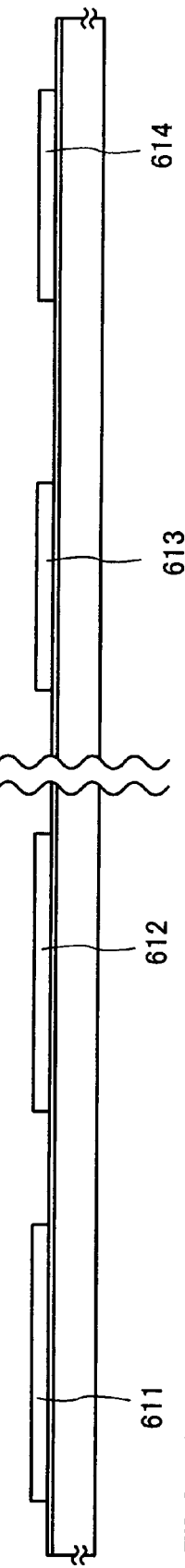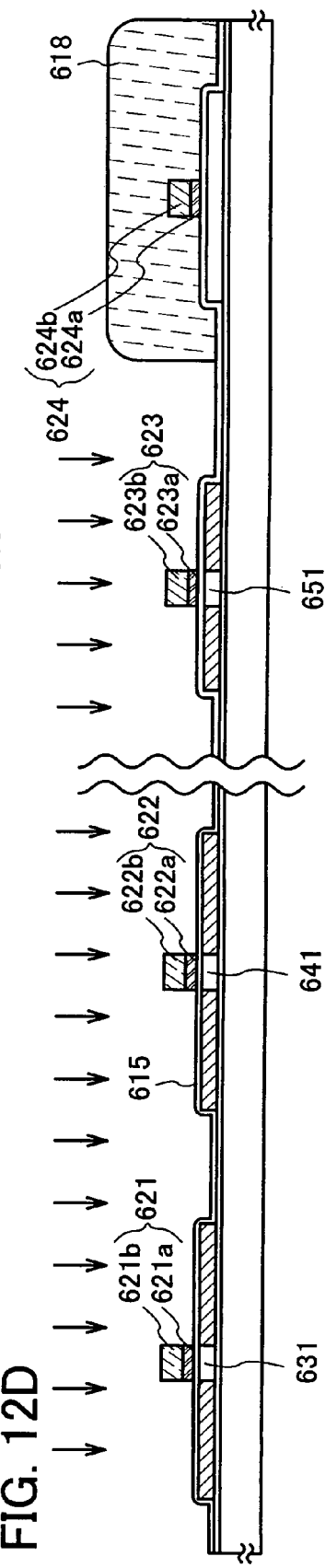

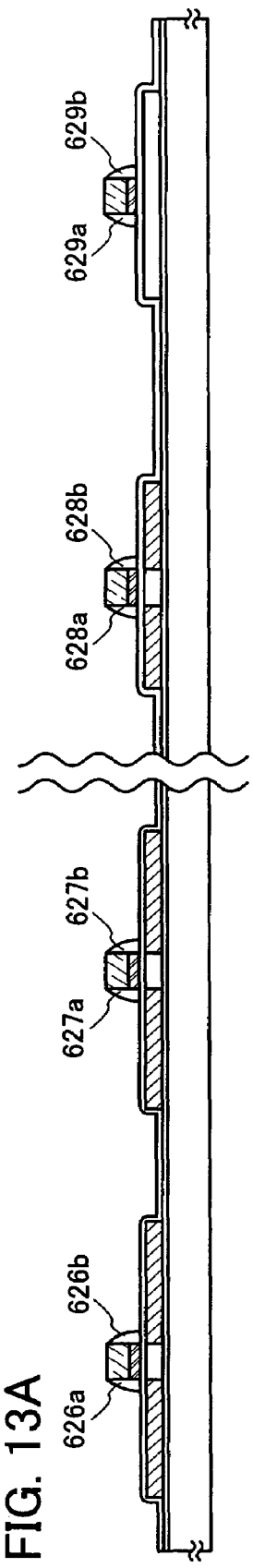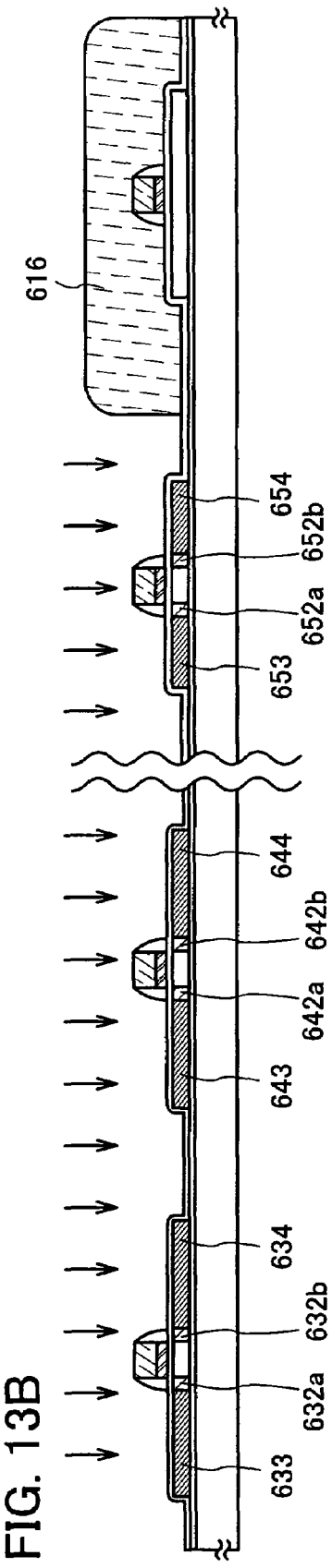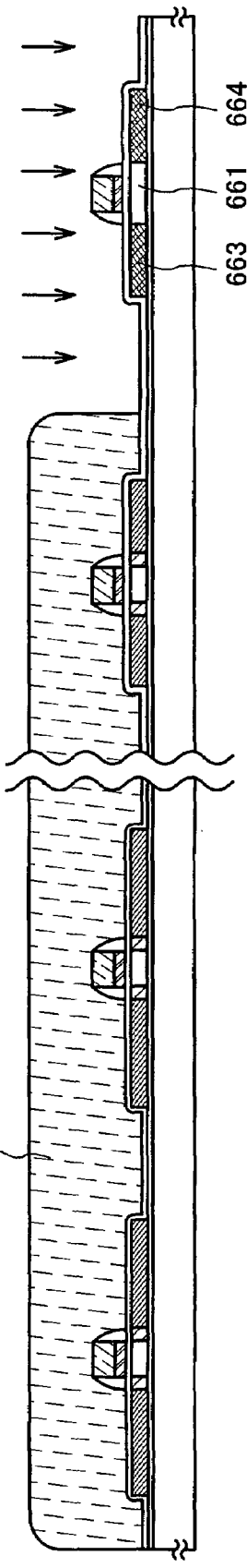

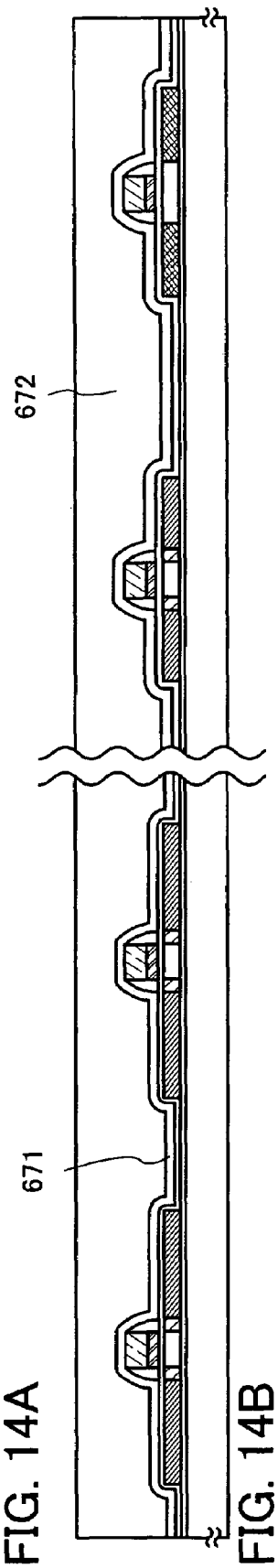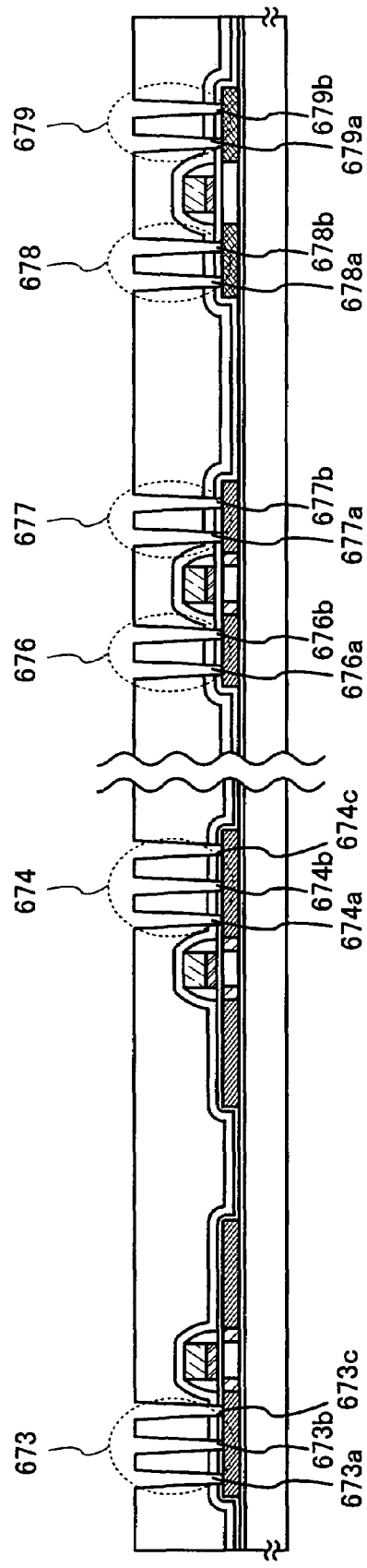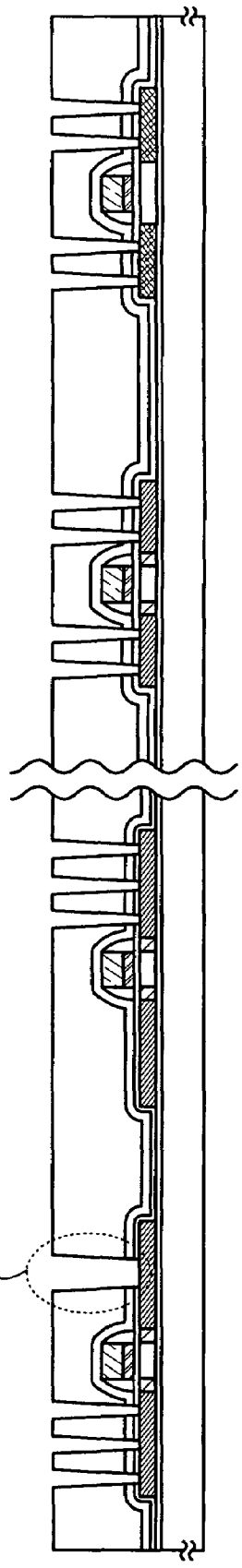

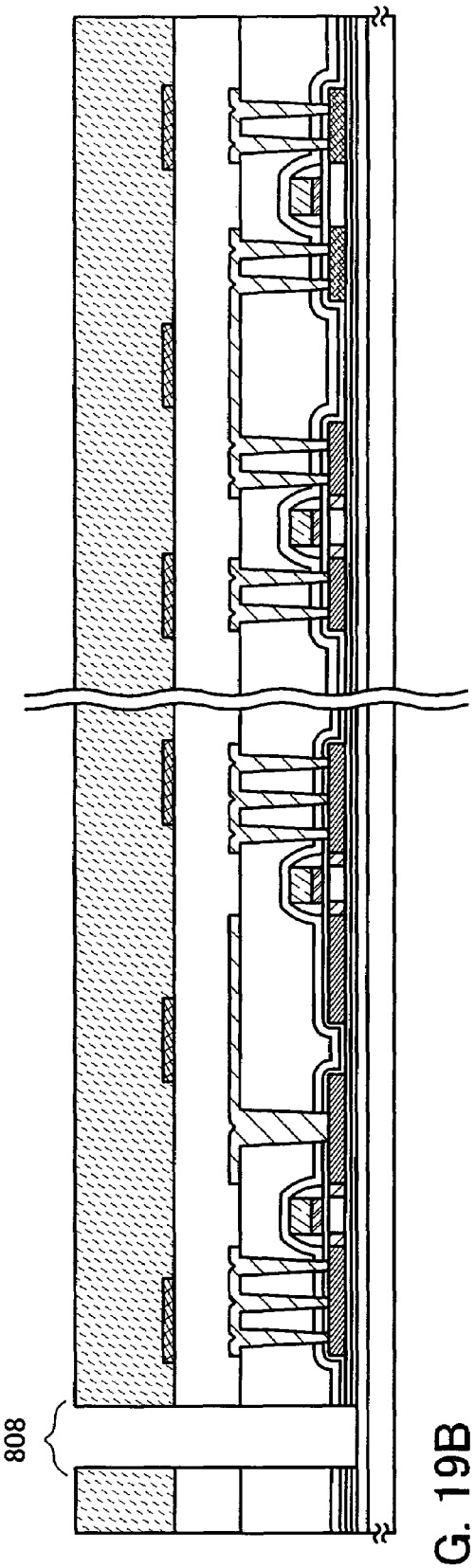
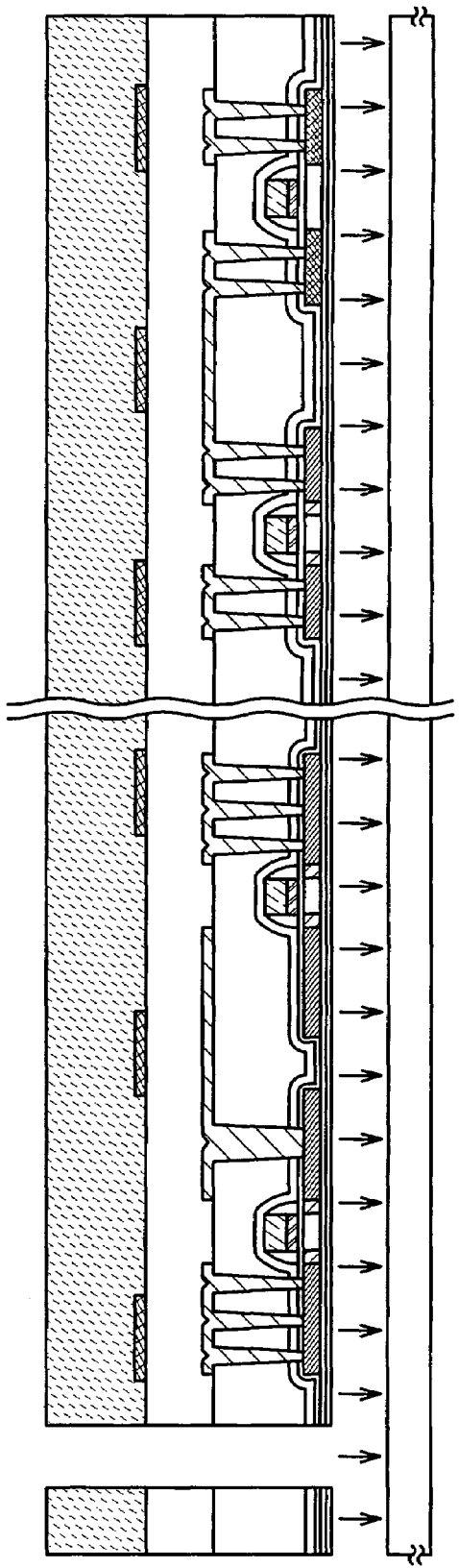
FIG. 19A
FIG. 19B
808

SEMICONDUCTOR DEVICE AND MANUFACTURING METHOD THEREOF

BACKGROUND OF THE INVENTION

1. Field of the Invention

The present invention relates to semiconductor devices capable of communication with the use of contactless means such as wireless communication, and a manufacturing method thereof. In particular, the present invention relates to a semiconductor device that is formed over an insulating substrate of glass, plastic, or the like and a manufacturing method thereof.

2. Description of the Related Art

With development of computer technologies and improvement of image recognition technologies, data identification methods utilizing a medium such as bar codes have spread widely and have been used for identification of product data and the like. It is expected that the amount of data to be identified will further increase in the future. On the other hand, data identification utilizing bar codes is disadvantageous in that a bar code reader is required to be in contact with the bar codes, and that the amount of data capable of being stored in the bar codes is small. Therefore, contactless data identification and increase in the storage capacity of a medium are required.

In view of the foregoing requirements, a semiconductor device capable of wireless communication with the use of an IC (also referred to as an ID chip, an IC chip, an IC tag, an ID tag, a wireless chip, or an RFID) has been developed recently. The data is stored in a memory circuit in the IC in the semiconductor device and is read by contactless means, generally wireless means. It is expected that practical application of such a semiconductor device will allow commercial distribution and the like to be simplified and made cheaper while ensuring high security.

An overview of an individual recognition system using the above-described semiconductor device capable of wireless communication with the use of an IC is described with reference to FIG. 2, FIG. 3, and FIGS. 4A and 4B. FIG. 2 illustrates an overview of an individual recognition system for obtaining individual data on a bag without contact.

A semiconductor device 221 storing particular individual data is attached to or embedded in a bag 224. A signal is transmitted to the semiconductor device 221 from an antenna unit 222 which is electrically connected to an interrogator (also referred to as a reader/writer) 223. When receiving the signal, the semiconductor device 221 sends back the individual data that the semiconductor device holds to the antenna unit 222. The antenna unit 222 sends the individual data to the interrogator 223, and the interrogator 223 identifies the individual data. In this manner, the interrogator 223 can obtain the individual data on the bag 224. Furthermore, this system enables physical distribution management, counting, exclusion of a counterfeits, and the like.

For example, such a semiconductor device has a structure shown in FIG. 3. A semiconductor device 200 includes an antenna circuit 201, a rectifier circuit 202, a stabilizing power supply circuit 203, an amplifier 208, a demodulation circuit 213, a logic circuit 209, a memory control circuit 212, a memory circuit 211, a logic circuit 207, an amplifier 206, and a modulation circuit 205.

For example, the antenna circuit 201 includes an antenna coil 241 and a capacitor 242 (FIG. 4A). For example, the rectifier circuit 202 includes diodes 243 and 244 and a capacitor 245 (FIG. 4B).

An operation of such a semiconductor device 200 capable of wireless communication with the use of an IC is described below. A wireless signal received by the antenna circuit 201 is half-wave rectified by the diodes 243 and 244 and then smoothed by the capacitor 245. The smoothed voltage containing a plurality of ripples is stabilized by the stabilizing power supply circuit 203, and the stabilized voltage is supplied to the demodulation circuit 213, the modulation circuit 205, the amplifier 206, the logic circuit 207, the amplifier 208, the logic circuit 209, the memory circuit 211, and the memory control circuit 212.

Moreover, a signal received by the antenna circuit 201 is input to the logic circuit 209 as a clock signal through the amplifier 208. Further, a signal input from the antenna coil 241 is demodulated by the demodulation circuit 213 and input as data to the logic circuit 209.

In the logic circuit 209, the input data is decoded. Since the interrogator 223 sends data after having encoded it, the logic circuit 209 decodes the data. The decoded data is sent to the memory control circuit 212, and then data stored in the memory circuit 211 is read out.

It is necessary that the memory circuit 211 be a nonvolatile memory circuit which is capable of storing data even when the power is OFF, and a ROM (Read Only Memory), or the like is employed (Japanese Patent No. 3578057).

As a transmitted/received signal, 125 kHz, 13.56 MHz, 915 MHz, 2.45 GHz, or the like may be employed, to each of which the ISO standard or the like is applied. In addition, a standard is also set for a modulation and demodulation system in transmission/reception.

In order to manufacture the above-described semiconductor device capable of wireless communication with the use of an IC, in a nonvolatile memory circuit, for example, a mask ROM has been necessarily formed as described above.

However, the mask ROM (hereinafter simply referred to as a ROM) can only write data at the time of manufacturing. Therefore, data is written at the same time as the manufacture of the mask ROM in manufacturing the semiconductor device.

Individual data of an individual semiconductor device such as an ID number is stored in a ROM. The individual data such as the ID number varies between individual semiconductor devices. However, since the ROM is generally manufactured by photolithography, in order to vary the individual data such as the ID number between the individual semiconductor devices, a photomask has to be formed for every one of them. Thus, when the individual data such as the ID numbers are formed to be all different, a heavy burden is imposed on manufacturing cost and the manufacturing process.

Therefore, in manufacturing a semiconductor device like this, there is a method for forming data in a ROM with a laser direct drawing apparatus (also referred to as a laser light exposure direct drawing apparatus), an electron beam direct drawing apparatus (also referred to as an electron light exposure direct drawing apparatus or an electron beam light exposure apparatus), or the like instead of using photolithography. When a semiconductor device is manufactured with any of these direct drawing apparatuses or the like, it becomes easy to vary individual data such as an ID number written to individual semiconductor devices.

However, the method for manufacturing the semiconductor device with the laser direct drawing apparatus, an electron beam direct drawing apparatus, or the like is less precise than a method using photolithography. In addition, when the laser direct drawing apparatus, the electron beam direct drawing apparatus, or the like is used, there is a possibility that a manufactured semiconductor device may not match the design rule.

In consideration of such a situation, the present invention provides a semiconductor device, and a method of manufacturing the semiconductor device, capable of wireless communication with the use of ICs, in which each semiconductor device comprises a ROM including individual data, such as an ID number, different from the individual data of another semiconductor device.

SUMMARY OF THE INVENTION

In order to solve the above-described problems, in manufacturing a semiconductor device capable of communication via wireless communication of the present invention, one feature is that different data is written to each semiconductor device by photolithography, a method using a direct drawing apparatus (a laser direct drawing apparatus, an electron beam direct drawing apparatus, or the like), and the like to form a ROM.

In the present invention, the above-described different data to each semiconductor device means individual data such as an ID number corresponding to an individual semiconductor device.

In the semiconductor device (also referred to as an ID chip, an IC chip, an IC tag, an ID tag, a wireless chip, or an RFID) capable of communication via wireless communication of the present invention, a ROM and a logic circuit are formed. Each of the ROM and the logic circuit includes a thin film transistor (TFT). One feature of the present invention is that an area of one of a source region and a drain region of the TFT for forming a memory cell in the ROM is larger than an area of the other one of the source region and the drain region of the TFT of the logic circuit portion. In addition, another feature of the present invention is that in the TFT for forming the memory cell in the ROM of the present invention, contact holes having different diameters between the source region and the drain region are formed.

In order to form a ROM using the TFT having the above-described structure, a combination of laser light exposure and light exposure using a photomask, for example, a stepper light exposure can be employed.

Another feature is that in the TFT for forming the memory cell in the ROM of the present invention, the number of contact holes is different between the source region and the drain region.

Another feature is that in the TFT for forming the memory cell in the ROM of the present invention, a sum of areas of bases of the contact holes of the source region is equal to a sum of areas of bases of contact holes of the drain region. When the sum of the areas of the bases of the contact holes of the source region is equal to the sum of the areas of the bases of the contact holes of the drain region, a current density of a current flowing through the source region can be made to be equal to a current density of a current flowing through the drain region. Note that the term "equal" and "same" are used throughout this specification, without exactly meaning equal or the same; therefore, these terms should also be understood to mean about (approximately) equal or the same. The reason for this is, a diameter of a contact hole according to a design (layout), and the diameter of the contact hole actually formed are slightly different.

Another feature is that in the TFT for forming the memory cell in the ROM of the present invention, the contact holes of the source region and the contact holes of the drain region can be easily formed with light exposure apparatuses having different precisions, that is, a stepper apparatus, a direct drawing apparatus (such as a laser direct drawing apparatus and an electron beam light exposure apparatus), and the like.

Opening position data of a contact hole for determining individual data such as an ID number is determined by a combination of random number data generated by an external random number generator program with layout data including coordinate data and shape data. The determined opening position data is converted by a conversion editor and then stored in a laser direct drawing apparatus as writing data. A contact hole is formed by laser light exposure or the like based on this writing data (FIG. 11).

However, because the random number data has to be formed by the random number generator program in the outside of the laser direct drawing apparatus and the layout data and the random number data have to be combined, a manufacturing process of a semiconductor device capable of wireless communication with the use of an IC needs a lot of time and cost.

According to the present invention, a semiconductor device capable of wireless communication with the use of an IC can be easily and speedily manufactured by a combination of layout data including coordinate data and shape data, which is formed for determining the shape and position of a semiconductor film, an electrode, a wiring, an insulating film, and the like with ID data for determining individual data such as an ID number of an individual semiconductor device, which is formed by a random number generator program stored in a laser direct drawing apparatus.

The present invention relates to a semiconductor device which includes: a thin film transistor, over a substrate, including an island-like semiconductor film including a channel forming region, a source region, and a drain region, a gate insulating film adjacent to the island-like semiconductor film, and a gate electrode adjacent to the island-like semiconductor film; an interlayer insulating film over the thin film transistor; a first contact hole formed in the interlayer insulating film including a plurality of contact holes, which reaches one of the source region and the drain region; and a second contact hole which is formed in the interlayer insulating film and reaches the other of the source region and the drain region, in which a diameter of the second contact hole is larger than a diameter of each of the plurality of contact holes included in the first contact hole, and a sum of areas of bases of the plurality of contact holes included in the first contact hole is equal to an area of a base of the second contact hole.

Further, the present invention relates to a manufacturing method of a semiconductor device, including the steps of: forming an island-like semiconductor film over a substrate; forming a gate insulating film adjacent to the island-like semiconductor film; forming a gate electrode adjacent to the gate insulating film; adding an impurity imparting one conductivity type into the island-like semiconductor film so as to form a channel forming region, a source region, and a drain region in the island-like semiconductor film; forming an interlayer insulating film so as to cover the island-like semiconductor film, the gate insulating film, and the gate electrode; forming, in the interlayer insulating film, a first contact hole which includes a plurality of contact holes and reaches one of the source region and the drain region; and forming, in the interlayer insulating film, a second contact hole which reaches the other of the source region and the drain region; in which a diameter of the second contact hole is larger than a diameter of each of the plurality of contact holes included in the first contact hole, and a sum of areas of bases of the plurality of contact holes included in the first contact hole is equal to an area of a base of the second contact hole.

In the present invention, the thin film transistor is used in a nonvolatile memory circuit.

In the present invention, the plurality of contact holes included in the first contact hole is formed with a stepper apparatus or the like, and the second contact hole is formed with a laser direct drawing apparatus, an electron beam direct drawing apparatus, or the like.

The present invention relates to a semiconductor device which includes: a first thin film transistor, over a substrate, including a first island-like semiconductor film including a first channel forming region, a first source region, and a first drain region, a gate insulating film adjacent to the first island-like semiconductor film, and a first gate electrode adjacent to the first island-like semiconductor film; a second thin film transistor, over the substrate, including a second island-like semiconductor film including a second channel forming region, a second source region, and a second drain region, the gate insulating film adjacent to the second island-like semiconductor film, and a second gate electrode adjacent to the second island-like semiconductor film; an interlayer insulating film over the first thin film transistor and the second thin film transistor; a first contact hole formed in the interlayer insulating film and including a plurality of contact holes, which reaches one of the first source region and the first drain region; a second contact hole formed in the interlayer insulating film and including a plurality of contact holes, which reaches one of the second source region and the second drain region; and a third contact hole which is formed in the interlayer insulating film and reaches either the other of the first source region and the first drain region or the other of the second source region and the second drain region, in which a diameter of the third contact hole is larger than a diameter of each of the plurality of contact holes included in the first contact hole and the plurality of contact holes included in the second contact hole, and a sum of areas of bases of the plurality of contact holes included in the first contact hole, a sum of areas of bases of the plurality of contact holes included in the second contact hole, and an area of a base of the third contact hole are equal.

Further, the present invention relates to a manufacturing method of a semiconductor device, including the steps of: forming a first island-like semiconductor film and a second island-like semiconductor film over a substrate; forming a gate insulating film adjacent to the first island-like semiconductor film and the second island-like semiconductor film; forming a first gate electrode adjacent to the first island-like semiconductor film and the gate insulating film; forming a second gate electrode adjacent to the second island-like semiconductor film and the gate insulating film; adding an impurity imparting one conductivity type into the first island-like semiconductor film and the second island-like semiconductor film so as to form a first channel forming region, a first source region, and a first drain region in the first island-like semiconductor film and so as to form a second channel forming region, a second source region, and a second drain region in the second island-like semiconductor film; forming an interlayer insulating film so as to cover the first island-like semiconductor film, the second island-like semiconductor film, the gate insulating film, the first gate electrode, and the second gate electrode; forming, in the interlayer insulating film, a first contact hole which includes a plurality of contact holes and reaches one of the first source region and the first drain region; forming, in the interlayer insulating film, a second contact hole which includes a plurality of contact holes and reaches one of the second source region and the second drain region; and forming, in the interlayer insulating film, a third contact hole which reaches either the other of the first source region and the first drain region or the other of the second source region and the second drain region, in which a diameter of the third contact hole is larger than a diameter of each of the plurality of contact holes included in the first contact hole and the plurality of contact holes included in the second contact hole, and a sum of areas of bases of the plurality of contact holes included in the first contact hole, a sum of areas of bases of the plurality of contact holes included in the second contact hole, and an area of a base of the third contact hole are equal.

In the present invention, the first thin film transistor and the second thin film transistor are used in a nonvolatile memory circuit.

In the present invention, the plurality of contact holes included in the first contact hole and the plurality of contact holes included in the second contact hole are formed with a stepper apparatus or the like, and the third contact hole is formed with a laser direct drawing apparatus, an electron beam direct drawing apparatus, or the like.

The present invention relates to a semiconductor device which includes: a first thin film transistor, over a substrate, including a first island-like semiconductor film including a first channel forming region, a first source region, and a first drain region, a first gate insulating film adjacent to the first island-like semiconductor film, and a first gate electrode adjacent to the first island-like semiconductor film; a second thin film transistor, over the substrate, including a second island-like semiconductor film including a second channel forming region, a second source region, and a second drain region, a second gate insulating film adjacent to the second island-like semiconductor film, and a second gate electrode adjacent to the second island-like semiconductor film; an interlayer insulating film over the first thin film transistor and the second thin film transistor; a first contact hole which is formed in the interlayer insulating film and reaches one of the first source region and the first drain region; a second contact hole which is formed in the interlayer insulating film and reaches the other of the first source region and the first drain region; a third contact hole formed in the interlayer insulating film and including a plurality of contact holes, which reaches one of the second source region and the second drain region; and a fourth contact hole which is formed in the interlayer insulating film and reaches the other of the second source region and the second drain region, in which an area of a base of the first contact hole is equal to an area of a base of the second contact hole, a diameter of the fourth contact hole is larger than a diameter of each of the plurality of contact holes included in the third contact hole, and a sum of areas of bases of the plurality of contact holes included in the third contact hole and an area of a base of the fourth contact hole are larger than an area of a base of the first contact hole and an area of a base of the second contact hole, respectively.

Further, the present invention relates to a manufacturing method of a semiconductor device, including the steps of: forming a first island-like semiconductor film and a second island-like semiconductor film over a substrate; forming a gate insulating film adjacent to the first island-like semiconductor film and the second island-like semiconductor film; forming a first gate electrode adjacent to the first island-like semiconductor film and the gate insulating film; forming a second gate electrode adjacent to the second island-like semiconductor film and the gate insulating film; adding a first impurity imparting one conductivity type into the first island-like semiconductor film so as to form a first channel forming region, a first source region, and a first drain region in the first island-like semiconductor film; adding a second impurity imparting one conductivity type into the second island-like semiconductor film so as to form a second channel forming region, a second source region, and a second drain region in the second island-like semiconductor film; forming an interlayer insulating film so as to cover the first island-like semiconductor film, the second island-like semiconductor film, the gate insulating film, the first gate electrode, and the second gate electrode; forming, in the interlayer insulating film, a first contact hole which reaches one of the first source region and the first drain region; forming, in the interlayer insulating film, a second contact hole which reaches the other of the first source region and the first drain region; forming, in the interlayer insulating film, a third contact hole which includes a plurality of contact holes and reaches one of the second source region and the second drain region, and forming, in the interlayer insulating film, a fourth contact hole which reaches the other of the second source region and the second drain region, in which an area of a base of the first contact hole is equal to an area of a base of the second contact hole, a diameter of the fourth contact hole is larger than a diameter of each of the plurality of contact holes included in the third contact hole, and a sum of areas of bases of the plurality of contact holes included in the third contact hole and an area of a base of the fourth contact hole are larger than an area of a base of the first contact hole and an area of a base of the second contact hole, respectively.

In the present invention, the second thin film transistor is used in a nonvolatile memory circuit, and the first thin film transistor is used in a logic circuit for controlling the nonvolatile memory circuit.

In the present invention, the first contact hole, the second contact hole, and the plurality of contact holes included in the third contact hole are each formed with a stepper apparatus or the like, and the fourth contact hole is formed with a laser direct drawing apparatus, an electron beam direct drawing apparatus, or the like.

Note that in this specification, needless to say, it is obvious that the contact holes can be formed with an apparatus necessary for forming the contact holes, such as an etching apparatus, a resist formation apparatus, a peeling apparatus, or a film formation apparatus, other than the stepper apparatus, the laser direct drawing apparatus, and the electron beam direct drawing apparatus.

Note that in this specification, a semiconductor device refers to all types of devices which can function by using semiconductor characteristics. An electro-optical device, a semiconductor circuit, and an electronic device are all included in the category of the semiconductor device.

By the present invention, different individual data such as ID numbers can be easily given to individual semiconductor devices capable of wireless communication with the use of ICs.

Further, in a TFT for forming a memory cell in a ROM, a current density in a contact portion of a source region can be made to be equal to a current density in a contact portion of a drain region.

Owing to this, heating of either one of the source region and the drain region can be prevented, thereby preventing an adverse effect on the TFT.

According to the above description, it is clear that the present invention enables the manufacturing of a TFT for forming a memory cell in a ROM with improved reliability.

BRIEF DESCRIPTION OF DRAWINGS

In the accompanying drawings:

FIG. 7 is a cross sectional view of a semiconductor device of the present invention;

FIG. 9 is a cross sectional view of a semiconductor device of the present invention;

FIGS. 12A to 12D are cross sectional views showing a manufacturing process of a semiconductor device of the present invention;

FIGS. 13A to 13C are cross sectional views showing a manufacturing process of a semiconductor device of the present invention;

FIGS. 14A to 14C are cross sectional views showing a manufacturing process of a semiconductor device of the present invention;

FIGS. 19A and 19B are cross sectional views showing a manufacturing process of a semiconductor device of the present invention;

DETAILED DESCRIPTION OF THE INVENTION

Figure 1:
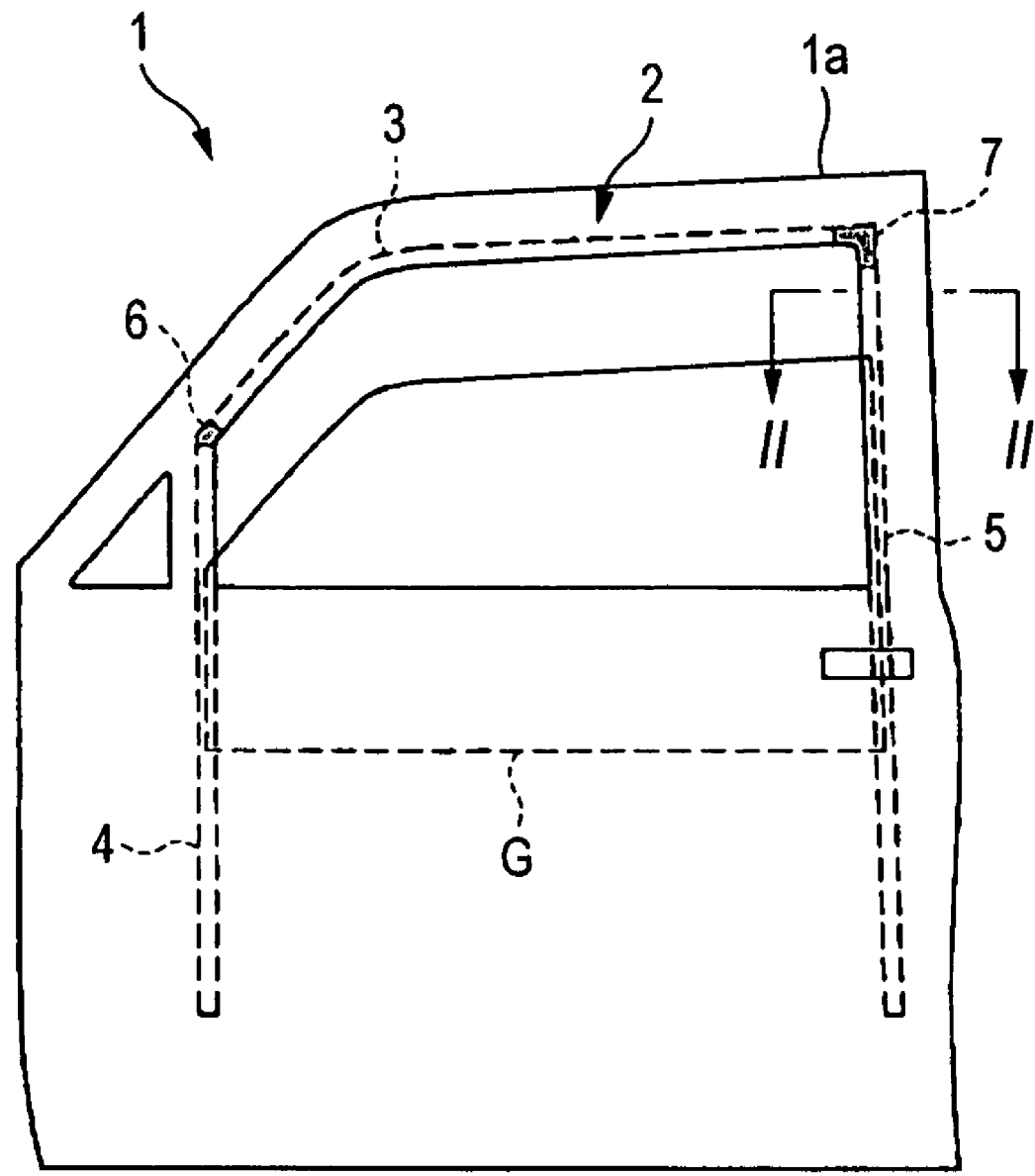
FIG. 1 is a top view of a memory cell array of the present invention.

Embodiment modes and embodiments of the present invention will be described with reference to the drawings. It is easily understood by those skilled in the art that various changes may be made in forms and details without departing from the spirit and the scope of the invention. Therefore, the present invention should not be limited to the descriptions of the embodiment modes and embodiments below. In addition, in the following drawings, the same reference numerals are commonly given to the same components or components having a similar function, and the repetitive description thereof is omitted.

Embodiment Mode 1

Embodiment Mode 1 will be described with reference to FIGS. 1, 5, 7, 8A and 8B, 9, 10, 12A to 12D, 13A to 13C, 14A to 14C, and 15. Note, while thin film transistors having a top gate configuration are shown, they may also have a bottom gate configuration instead of the top gate configuration.

FIG. 1 is a top view of a memory cell array in a mask ROM, and FIG. 7 is a cross sectional view taken along a line A-A' in FIG. 1.

The storage state of the mask ROM shown in FIGS. 1 and 7 is expressed by whether or not a contact hole is formed to reach a source region or a drain region of a TFT that forms a memory cell that is formed in the mask ROM.

For simplicity, FIGS. 1 and 7 show a memory cell array for 4 bits. However, a nonvolatile memory circuit of the present invention is not limited to 4 bits.

In FIGS. 1 and 7, TFTs 118 to 121 are n-channel TFTs, and the TFT 118 includes an island-like semiconductor film 131, which is an active layer, and a gate electrode 103 as shown in FIG. 1. The TFT 119 includes an island-like semiconductor film 132, which is an active layer, and a gate electrode 104. The TFT 120 includes an island-like semiconductor film 133, which is an active layer, and a gate electrode 105. The TFT 121 includes an island-like semiconductor film 134, which is an active layer, and a gate electrode 106. The gate electrodes 103 and 104 are electrically connected to a word line 107, and the gate electrodes 105 and 106 are electrically connected to a word line 108.

In each of the island-like semiconductor films 131 to 134, a plurality of contact holes 142 each having a small diameter are formed over one of a source region and a drain region by photolithography such as a light exposure method using a stepper apparatus or the like. Over the other of the source region and the drain region, only a single contact hole 141 having a large diameter is, if needed, formed by a light exposure method or the like using a laser direct drawing apparatus, an electron beam direct drawing apparatus, or the like. Note that in the present specification, "diameter" of a contact hole means a "full diameter" of a contact hole.

The formation of the contact holes is carried out so that a sum of areas of bases of the plurality of contact holes each of which has a small diameter and reaches one of the source region and the drain region, is equal to an area of a base of the single contact hole which has a large diameter and reaches the other of the source region and the drain region. Accordingly, a current flowing through the one of the source region and the drain region and a current flowing through the other of the source region and the drain region can have an equal current density value.

It is certainly preferable that the sum of areas of the bases of the plurality of contact holes, each of which has a small diameter, is actually equal to the area of the base of the single contact hole, which has a large diameter. However, when forming the contact hole which has a large diameter by laser light exposure using a laser direct drawing apparatus, an electron beam direct drawing apparatus, or the like, for example, in the case with the laser direct drawing apparatus, there is a possibility that the area of the base is influenced by displacement of a position of a beam spot owing to vibration of a laser beam in the manufacturing process. Further, in the case of forming contact holes, each of which has a small diameter, with a stepper apparatus or the like, there is a possibility that the areas of the bases are influenced by a development state after light exposure and an etching state after the development.

Therefore, in this specification, contact holes shall be designed so that the contact holes which need to have an equal area have an equal area at least at a design (layout) stage when it is described that a sum of areas of bases of a plurality of contact holes is the same as (equal to) an area of a base of a single contact hole; areas of bases of two contact holes are the same; or a sum of areas of bases of a plurality of contact holes is the same as (equal to) a sum of areas of bases of another plurality of contact holes. Further, when a demanded function is satisfied in a completed semiconductor device, for example, when contact holes have the same current density, the areas of the contact holes are also considered to be the same (equal).

One of the source region and the drain region of the TFT 118 and one of the source region and the drain region of the TFT 120 are electrically connected to a bit line 109 through the contact holes 142. One of the source region and the drain region of the TFT 119 and one of the source region and the drain region of the TFT 121 are electrically connected to a bit line 110 through the contact holes 142.

The other of the source region and the drain region of each of the TFTs 118 to 121 is connected to a power supply line 113 through the contact hole 141 according to need. The storage state of the mask ROM is determined by whether to form the contact hole 141.

As shown in FIG. 7, the TFT 118 is formed over a first base film 152 and a second base film 153, which are formed over a substrate 151. The TFT 118 includes the island-like semiconductor film 131, a gate insulating film 154, the gate electrode 103 including a lower-layer gate electrode 103*a* and an upper-layer gate electrode 103*b*, and sidewalls 171*a* and 171*b*. The island-like semiconductor film 131 includes a region 163, which is one of a source region and a drain region; a region 164, which is the other of the source region and the drain region; low-concentration impurity regions 162*a* and 162*b*; and a channel forming region 161.

The TFT 119 is formed over the first base film 152 and the second base film 153, which are formed over the substrate 151. The TFT 119 includes the island-like semiconductor film 132, the gate insulating film 154, the gate electrode 104 including a lower-layer gate electrode 104*a* and an upper-layer gate electrode 104*b*, and sidewalls 191*a* and 191*b*. The island-like semiconductor film 132 includes a region 184, which is one of a source region and a drain region; a region 183, which is the other of the source region and the drain region; low-concentration impurity regions 182*a* and 182*b*, and a channel forming region 181.

Over the TFTs 118 and 119, a first interlayer insulating film 155 is formed, and further, a second interlayer insulating film 156 is formed thereover. In the gate insulating film 154, the first interlayer insulating film 155, and the second interlayer insulating film 156, the contact holes 141 and 142 are formed.

Note that each of the TFTs 120 and 121 has a cross sectional structure similar to either of the TFT 118 or the TFT 119. The contact hole 141 is formed if needed.

The contact holes 142 are formed with a stepper apparatus or the like and each of them has a smaller diameter than the contact hole 141. Since the contact hole 141 is formed with a laser direct drawing apparatus, an electron beam direct drawing apparatus, or the like, the contact hole 141 has a larger diameter than the contact hole 142. Only one contact hole is formed as the contact hole 141. In accordance with the size of the contact hole 141, the island-like semiconductor films 131 to 134 are formed so that each has a larger area than an island-like semiconductor film included in a TFT of a logic circuit to be described later. The plurality of contact holes 142 is formed so that a sum of areas of bases of the contact holes 142 is the same as an area of a base of the contact hole 141.

The bit lines 109 and 110 and the power supply line 113 are formed over the second interlayer insulating film 156.

In this embodiment mode, the diameter of each of the contact holes 142 is designed to be 1 μm, for example, and the diameter of the contact hole 141 is designed to be 3 μm, for example.

Figure 8A:
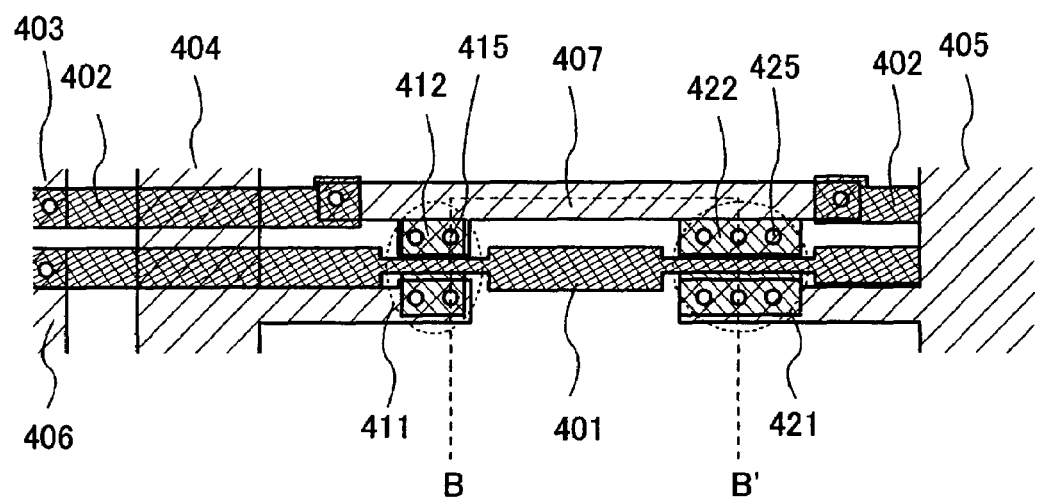
FIGS. 8A and 8B are a top view and a circuit diagram of a semiconductor device of the present invention.
Figure 8B:
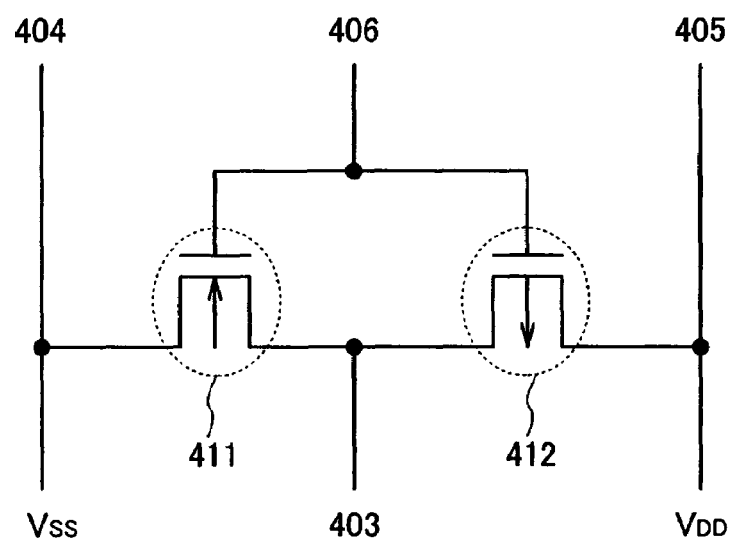

FIG. 8A is a top view of a TFT of a logic circuit for controlling a mask ROM, FIG. 8B is a circuit diagram of the logic circuit, and FIG. 9 is a cross sectional view taken along a line B-B' of FIG. 8A. The basic configuration of the logic circuit is a CMOS circuit in which an n-channel TFT and a p-channel TFT are connected complementarily. A column decoder and a row decoder to be described later are formed using such a CMOS circuit. FIGS. 8A and 8B and FIG. 9 show an inverter using a CMOS circuit.

An n-channel TFT 411 of the logic circuit is formed in such a way that a gate wiring 401 is formed over an island-like semiconductor film 412, which is an active layer, with a gate insulating film 454 interposed therebetween. The island-like semiconductor film 412 includes a source region and a drain region, and contact holes 415 are formed over the source region and the drain region. One of the source region and the drain region of the TFT 411 is connected to a power supply line 404 via the contact holes 415, and the other of the source region and the drain region is connected to a wiring 407 via the contact holes 415.

A p-channel TFT 421 of the logic circuit is formed in such a way that the gate wiring 401 is formed over an island-like semiconductor film 422, which is an active layer, with the gate insulating film 454 interposed therebetween. The island-like semiconductor film 422 includes a source region and a drain region, and contact holes 425 are formed over the source region and the drain region. One of the source region and the drain region of the TFT 421 is connected to a power supply line 405 via the contact holes 425, and the other of the source region and the drain region is connected to a wiring 407 via the contact holes 425.

The wiring 407 electrically connects the other of the source region and the drain region of the n-channel TFT 411 to the other of the source region and the drain region of the p-channel TFT 421. Further, the wiring 407 is connected to a wiring 403 via a wiring 402, and the wiring 403 serves as an output terminal of the inverter.

The gate wiring 401 is connected to a wiring 406, and the wiring 406 serves as an input terminal of the inverter.

Although a low-concentration impurity region is not formed in the p-channel TFT 421 in this embodiment mode, a low-concentration impurity region may be formed if needed.

In FIGS. 8A and 8B and FIG. 9, the gate wiring 401 and the wiring 402 are formed using the same material and the same process. The wiring 403, the wiring 404, the wiring 405, and the wiring 406 are also formed using the same material and the same process. However, they may certainly be formed using different materials and different processes according to need.

As shown in FIG. 9, the n-channel TFT 411 is formed over a base film 453 which is formed over a substrate 451. The TFT 411 includes the island-like semiconductor film 412, the gate insulating film 454, a gate electrode 443 including a lower-layer gate electrode 443a and an upper-layer gate electrode 443b, and sidewalls 471a and 471b.

The island-like semiconductor film 412 includes a channel forming region 461, low-concentration impurity regions 462a and 462b, a region 463 which is one of a source region and a drain region, and a region 464 which is the other of the source region and the drain region.

The p-channel TFT 421 is formed over the base film 453 which is formed over the substrate 451. The TFT 421 includes the island-like semiconductor film 422, the gate insulating film 454, a gate electrode 444 including a lower-layer gate electrode 444a and an upper-layer gate electrode 444b, and sidewalls 491a and 491b.

The island-like semiconductor film 422 includes a channel forming region 481, a region 484 which is one of a source region and a drain region, and a region 483 which is the other of the source region and the drain region.

Over the TFTs 411 and 421, a first interlayer insulating film 455 and a second interlayer insulating film 456 are formed. The contact holes 415 and 425 are formed in the gate insulating film 454, the first interlayer insulating film 455, and the second interlayer insulating film 456. The contact holes 415 and 425 are formed with a stepper apparatus or the like, and each has the same (nearly equal) sum of areas of bases. In FIG. 8A and FIG. 9, a plurality of contact holes is formed as each of the contact holes 415 and 425; however, according to need, instead of the plurality of contact holes, a single contact hole may be formed.

The power supply line 404, the power supply line 405, the wiring 406, and the wiring 407 are formed over the second interlayer insulating film 456, and the power supply line 404 is electrically connected to the region 463 through the contact holes 415. The power supply line 405 is electrically connected to the region 484 through the contact holes 425. The wiring 407 is electrically connected to the region 464 through the contact holes 415 and also electrically connected to the region 483 through the contact holes 425.

The contact holes 415 and 425 are formed with a stepper apparatus or the like. With the stepper apparatus, a contact hole having a smaller diameter than the case of using a laser direct drawing apparatus or an electron beam direct drawing apparatus can be formed. The sum of the areas of the bases of the contact holes 415 and the sum of the areas of the bases of the contact holes 425 are smaller than the sum of the areas of the contact holes 142 and the area of the base of the contact hole 141, respectively. Accordingly, the source regions and the drain regions included in the island-like semiconductor films 412 and 422 can have a smaller area than the source regions and the drain regions included in the island-like semiconductor films 131 and 132 in the TFTs of the mask ROM.

Figure 5:
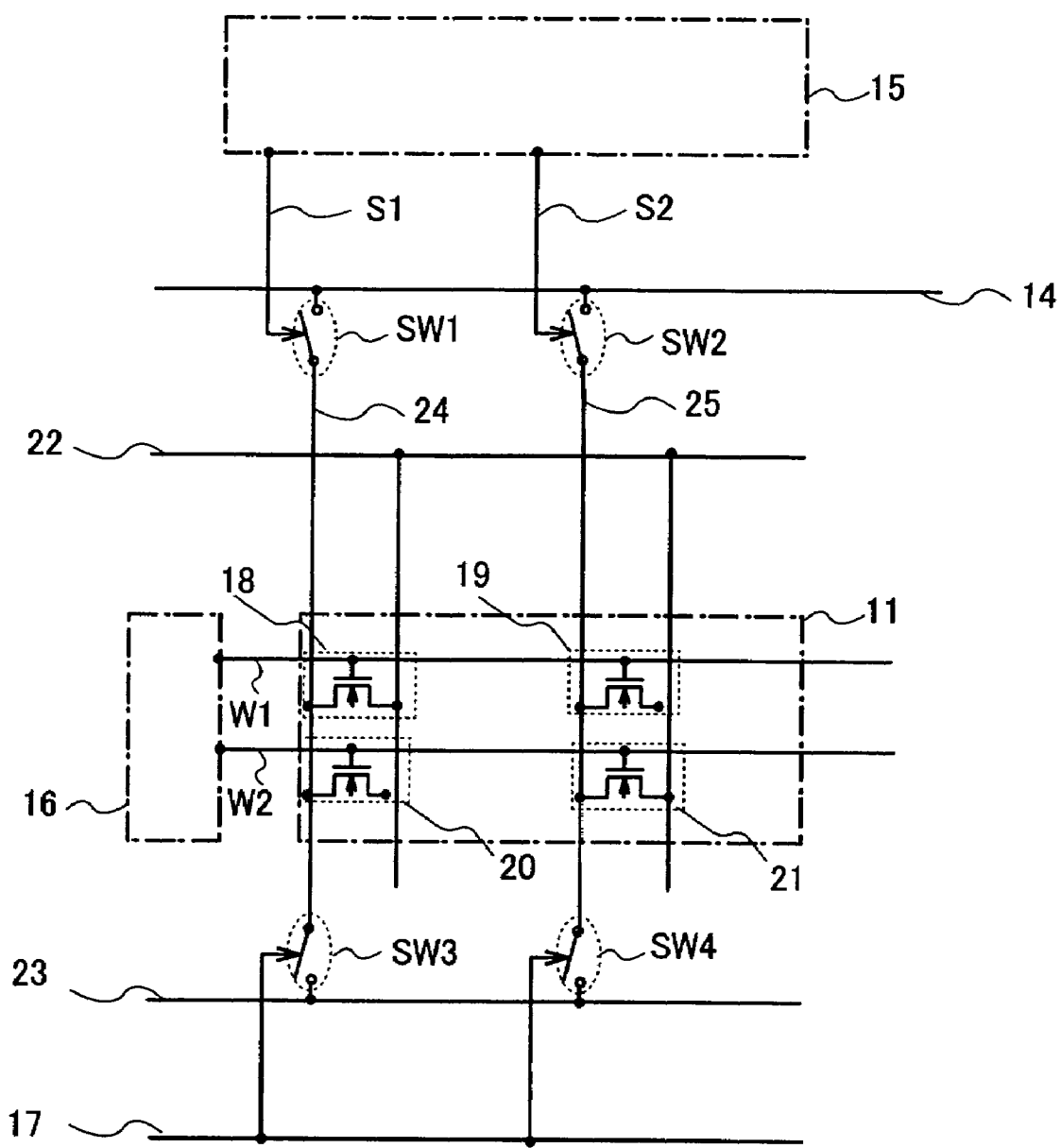
FIG. 5 is a circuit diagram of a nonvolatile memory circuit of the present invention.

The operation of the mask ROM using the present invention formed in the above-described process will be described with reference to FIG. 5. Note that the circuit configuration and the operation are not limited to the following descriptions as long as it is a circuit capable of reading individual data such as an ID number that is stored in or written to a memory cell. Further, for simple description, FIG. 5 shows operation of a memory cell for 2 bits, taking a 4-bit mask ROM as an example. However, the bit number and operation of the mask ROM is not limited to this description, the present invention is applicable in the case of a larger number of bits, and data of a memory cell for all bits is read out.

As shown in FIG. 5, the mask ROM using the present invention includes a column decoder 15, a row decoder 16, a memory cell array 11 including n-channel TFTs 18 to 21, bit lines (data lines) 24 and 25, word lines W1 and W2, a high voltage power supply (VDD) 22, a low voltage power supply (VSS or GND) 23, column switches SW1 to SW4, address lines S1 and S2 which are controlled by the column decoder 15, an output line 14, and a control line 17.

First, the operation of precharging a potential of the low voltage power supply (VSS or GND) using a quarter of a reading time, in reading individual data such as an ID number which is stored in or written to a 1-bit memory cell, will be described.

The control line 17 is in a state of selecting the SW3 and the SW4 for a quarter of a reading time, and sends a signal for electrically connecting the bit lines (data lines) 24 and 25 to the low voltage power supply (VSS or GND) 23. Thus, each of the bit lines (data lines) 24 and 25 obtains a potential of a low voltage power supply (VSS or GND).

At this time, the word lines W1 and W2 are not in a state of selecting the n-channel TFTs 18 to 21. Here, the selecting state indicates a state of electrically connecting a source terminal to a drain terminal of the n-channel TFTs 18 to 21.

The address lines S1 and S2, which are controlled by the column decoder 15, are also not in a state of selecting the column switches SW1 and SW2. Here, the selecting state indicates a state of electrically connecting the bit lines (data lines) 24 and 25 to the output line 14.

Regarding a voltage to be precharged, depending on the circuit configuration, the system, the logic, or the like, there are various cases such as a case of precharging a potential of the low voltage power supply (VSS or GND) as the present invention, a case of precharging a potential of the high voltage power supply (VDD), and a case of precharging a potential of a generation voltage other than the foregoing, and there is no limitation. The most appropriate voltage may be selected according to the case.

Next, the operation of reading the individual data such as an ID number from the mask ROM using the present invention, using the other three-fourths of the reading time, will be described. Here, in the case where a voltage having the same level as the high voltage power supply (VDD) is output, the read individual data such as an ID number is considered as High, and in the case where a voltage having the same level as the low voltage power supply (VSS or GND) is output, the read individual data is considered as Low. Whether the read individual data such as the ID number is High or Low depends on the circuit configuration, the system, the logic, and the like, and not limited to this description.

When the word line W1 is selected by the row decoder 16 and the address line S1 is selected by the column decoder 15, the n-channel TFT 18 is selected. Then, the source terminal and the drain terminal of the n-channel TFT 18 are electrically connected. That is, the bit line (data line) 24 and the high voltage power supply (VDD) 22, which are the source terminal and the drain terminal of the n-channel TFT 18, are electrically connected. The bit line is charged to a voltage which is a threshold amount of the n-channel TFT 18 lower than the voltage of the high voltage power supply (VDD) 22. Further, since the address line S1 is selected by the column decoder 15, the bit line (data line) 24 and the output line 14 are electrically connected. Here, since the bit line is charged to a voltage which is a threshold amount of the n-channel TFT 18 lower than the voltage of the high voltage power supply (VDD) 22, the output line 14 has the same potential as the bit line (data line) 24. That is, a voltage which is a threshold amount of the n-channel TFT 18 lower than the voltage of the high voltage power supply (VDD) 22 is output to the output line 14.

Although not shown, the voltage which is a threshold amount of the n-channel TFT 18 lower than the voltage of the high voltage power supply (VDD) 22 is made to pass through an amplifier, thereby a potential the same as that of the high voltage power supply (VDD) is output. Here, the amplifier is a circuit capable of increasing a voltage or a current, and may have a structure where two stages of inverters are connected or a structure using a comparator or the like.

Thus, the High which is the individual data such as the ID number stored in or written to the n-channel TFT 18 is output to the output line 14.

Similarly, when the word line WI is selected by the row decoder 16 and the address line S2 is selected by the column decoder 15, the n-channel TFT 19 is selected. One terminal of the n-channel TFT 19 is not connected to anywhere; however, by the above-described precharging operation, the bit line (data line) 25, which is the other terminal, has a potential of the low voltage power supply 23 (VSS or GND). That is, the one terminal of the n-channel TFT 19 and the other terminal have almost equal potentials to the potential of the low voltage power supply (VSS or GND) 23. Further, since the address line S2 is selected by the column decoder 15, the bit line (data line) 25 and the output line 14 are electrically connected. That is, a potential almost equal to that of the low voltage power supply (VSS or GND) 23 is output to the output line 14.

Thus, the Low, which is the individual data such as the ID number stored in or written to the n-channel TFT 19 is output to the output line 14.

In the above-described manner, the individual data such as the ID number stored in or written to the mask ROM using the present invention can be read out.

A process for manufacturing a TFT of a memory cell array and a TFT of a logic circuit over the same substrate will be described below with reference to FIG. 10, FIGS. 12A to 12D, FIGS. 13A to 13C, FIG. 14A to 14C, and FIG. 15.

First, as shown in FIG. 12A, a base film 602 is formed over a substrate 601. As the substrate 601, a glass substrate of barium borosilicate glass, alumino borosilicate glass, or the like, a quartz substrate, a stainless-steel substrate, an SOI (Silicon on Insulator) substrate which is formed by formation of a single crystalline semiconductor layer on an insulating surface, or the like can be used. Also, a substrate including a synthetic resin having flexibility such as acrylic or plastic represented by poly(ethylene terephthalate) (PET), poly (ether sulfone) (PES), or poly(ethylene Naphthalate) (PEN) can be used. A case of using a glass substrate as the substrate 601 will be described below.

The base film 602 is provided to prevent an alkali metal such as Na or an alkaline earth metal contained in the substrate 601 from diffusing into a semiconductor film and causing an adverse effect on a characteristic of a semiconductor element. Therefore, the base film 602 is formed using an insulating film of silicon nitride, silicon oxide containing nitrogen, or the like which can suppress diffusion of the alkali metal or alkaline earth metal into the semiconductor film. In this embodiment mode, the base film 602 is formed by a plasma CVD method by stacking a silicon oxide film and a silicon oxide film containing nitrogen so that thicknesses thereof are 10 to 100 nm (preferably 20 to 70 nm, more preferably 50 nm) and 10 to 400 nm (preferably 50 to 300 nm, more preferably 100 nm), respectively.

Note that the base film 602 may be a single layer of an insulating film containing silicon nitride, silicon oxide containing nitrogen, silicon nitride containing oxygen, or a stack of layers of a plurality of insulating films of silicon oxide, silicon nitride, silicon oxide containing nitrogen, silicon nitride containing oxygen, or the like. Further, in a case of using a substrate containing an alkali metal or alkaline earth metal in any amount such as a glass substrate, a stainless-steel substrate, or a plastic substrate, it is effective to provide a base film in terms of preventing diffusion of an impurity; however, if diffusion of an impurity is not much of a problem as in a case of using a quartz substrate, it is not always necessary to provide a base film.

Next, a semiconductor film 604 is formed over the base film 602. The thickness of the semiconductor film 604 is to be 25 to 100 nm (preferably, 30 to 80 nm). Note that the semiconductor film 604 may be an amorphous semiconductor or a polycrystalline semiconductor. Also, silicon germanium (SiGe) can be used as well as silicon (Si) as a semiconductor. In a case of using silicon germanium, the concentration of germanium is preferably about 0.01 to 4.5 atomic %. In this embodiment mode, an amorphous silicon film is formed to have a thickness of 66 nm as the semiconductor film 604.

Next, a linear beam 603 is emitted to the semiconductor film 604 from a laser irradiation apparatus to carry out crystallization, as shown in FIG. 12B.

In the case of carrying out laser crystallization, the semiconductor film 604 may be subjected to heating treatment at 500° C. for one hour before laser crystallization, in order to increase resistance of the semiconductor film 604 against a laser beam.

For the laser crystallization, a continuous wave laser or a pulsed laser with a repetition rate of 10 MHz or more, preferably 80 MHz or more as a pseudo CW laser can be used.

Specifically, the following and the like can be given as examples of the continuous wave laser: an Ar laser, a Kr laser, a $CO_2$ laser, a YAG laser, a $YVO_4$ laser, a forsterite ($Mg_2SiO_4$) laser, a YLF laser, a $YAlO_3$ laser, a $GdVO_4$ laser, a $Y_2O_3$ laser, an alexandrite laser, a Ti:sapphire laser, a helium cadmium laser, and a laser of which a medium is a polycrystalline (ceramic) YAQ $Y_2O_3$, $YVO_4$, $YAlO_3$, or $GdVO_4$, added with one or more of Nd, Yb, Cr, Ti, Ho, Er, Tm, and Ta as a dopant.

Also, as the pseudo CW laser, a pulsed laser such as the following can be used if pulse oscillation at a repetition rate of 10 MHz or more, preferably 80 MHz or more, is possible: an Ar laser, a Kr laser, an excimer laser, a $CO_2$ laser, a YAG laser, a $Y_2O_3$ laser, a $YVO_4$ laser, a forsterite ($Mg_2SiO_4$) laser, a YLF laser, $YAlO_3$ laser, a $GdVO_4$ laser, an alexandrite laser, a Ti:sapphire laser, a copper vapor laser, a gold vapor laser, or a laser of which a medium is a polycrystalline (ceramic) YAG, $Y_2O_3$, $YVO_4$, $YAlO_3$, or $GdVO_4$, added with one or more of Nd, Yb, Cr, Ti, Ho, Er, Tm, and Ta as a dopant.

Such a pulsed laser eventually exhibits an effect equivalent to that of a continuous wave laser when the repetition rate is increased.

For example, in a case of using a solid-state laser capable of continuous oscillation, a crystal with a large grain diameter can be obtained by irradiation with laser light of a second harmonic to a fourth harmonic. Typically, it is desirable to use a second harmonic (532 nm) or a third harmonic (355 nm) of the YAG laser (fundamental wave of 1064 nm). For example, laser light emitted from a continuous wave YAG laser is converted to a high harmonic by a nonlinear optical element, and emitted to the semiconductor film 604. The power density may be about 0.01 to 100 $MW/cm^2$ (preferably 0.1 to 10 $MW/cm^2$). Then, irradiation is carried out with a scanning speed of about 10 to 2000 cm/sec.

Note that a laser of which a medium is a single-crystalline YAG, $YVO_4$, forsterite ($Mg_2SiO_4$), $YAlO_3$, or $GdVO_4$ doped with one or more of Nd, Yb, Cr, Ti, Ho, Er, Tm, and Ta as a dopant, or a polycrystalline (ceramic) YAQ $Y_2O_3$, $YVO_4$, $YAlO_3$, or $GdVO_4$, doped with one or more of Nd, Yb, Cr, Ti, Ho, Er, Tm, and Ta as a dopant; an Ar laser; a Kr laser; or a Ti:sapphire laser is capable of continuous oscillation, and also capable of pulse oscillation by carrying out a Q switch operation, mode-locking, or the like. When a laser beam is oscillated at a repetition rate of 10 MHz or more, the semiconductor film is irradiated with a subsequent pulse while the semiconductor film is melted by a preceding laser and then solidified. Consequently, since a solid-liquid interface in the semiconductor film can be moved continuously unlike in a case of using a pulsed laser with a low repetition rate, crystal grains that continuously grow toward a scanning direction can be obtained.

When ceramics (polycrystals) are used for a medium, the medium can be formed into a free shape in a short amount of time and at low cost. When single crystals are used, a column-shaped medium with several mm in diameter and several tens of mm long is usually used, but a larger medium can be formed when ceramic is used.

Since the concentration of a dopant such as Nd or Yb in the medium which directly contributes to light emission cannot be changed significantly in either single crystals or polycrystals, improvement in laser output by increasing the concentration is limited to a certain extent. However, in the case of ceramics, there is a possibility that output can be drastically improved since the size of the medium can be significantly increased compared to single crystals.

Further, in the case of ceramics, a medium having a parallelepiped shape or a rectangular parallelepiped shape can be easily formed. When a medium having such a shape is used and oscillation light travels in a zigzag in the medium, an oscillation light path can be longer. Accordingly, amplification is increased and oscillation with high output becomes possible. Since a laser beam emitted from the medium having such a shape has a cross section of a quadrangular shape when being emitted, a linear beam can be easily shaped compared with the case of a circular beam. The laser beam emitted in such a manner is shaped by using an optical system; accordingly, a linear beam having a short side of less than or equal to 1 mm and a long side of several mm to several m can be easily obtained. In addition, by uniformly irradiating the medium with excited light, a linear beam has a uniform energy distribution in a long side direction.

By irradiation of the semiconductor film with this linear beam, the entire surface of the semiconductor film can be annealed more uniformly. In the case where uniform annealing is required from one end to the other end of the linear beam, slits may be provided for the ends so as to shield a portion where energy is attenuated from light.

By irradiating the semiconductor film 604 with laser light as mentioned above, a crystalline semiconductor film 605 with improved crystallinity is formed.

Next, as shown in FIG. 12C, the crystalline semiconductor film 605 is used to form island-like semiconductor films 611 to 614. These island-like semiconductor films 611 to 614 serve as active layers of TFTs to be formed in a subsequent process.

In this embodiment mode, the case of using a glass substrate as the substrate 601 is described; however, in the case of using an SOI substrate as the substrate 601, a single-crystalline semiconductor layer may be formed into an island shape to serve as an active layer of a TFT.

Next, an impurity is introduced into the island-like semiconductor films 611 to 614 for controlling threshold voltages. In this embodiment mode, boron (B) is introduced into the island-like semiconductor films 611 to 614 by doping of diborane ($B_2H_6$).

Next, a gate insulating film 615 is formed over the island-like semiconductor films 611 to 614. For the gate insulating film 615, silicon oxide, silicon nitride, silicon oxide containing nitrogen, or the like with a film thickness of 10 to 110 nm can be used, for example. Also, as a film formation method, a plasma CVD method, a sputtering method, or the like can be used. In this embodiment mode, the gate insulating film 615 is formed using a silicon oxide film containing nitrogen that is formed by a plasma CVD method to have a film thickness of 20 nm.

Then, after forming a conductive film over the gate insulating film 615, gate electrodes 621 to 624 are formed using the conductive film.

The gate electrodes 621 to 624 are formed to have a structure with a single layer of a conductive film, or a structure in which two or more layers of conductive films are stacked. In the case where two or more conductive films are stacked, the gate electrodes 621 to 624 may be formed by stacking layers of an element selected from tantalum (Ta), tungsten (W), titanium (Ti), molybdenum (Mo), or aluminum (Al); or an alloy material or compound material mainly containing the element. Alternatively, the gate electrodes may be formed using a semiconductor film typified by a polycrystalline silicon film doped with an impurity element such as phosphorus (P). In this embodiment mode, the gate electrodes 621 to 624 are formed using a tantalum nitride (TaN) film with a thickness of 10 to 50 nm, for example, 30 nm, which is formed as lower-layer gate electrodes 621a to 624a, and a tungsten (W) film with a thickness of 200 to 400 nm, for example, 370 nm, which is formed as upper-layer gate electrodes 621b to 624b.

The gate electrodes 621 to 624 may be formed as a portion of a gate wiring. Alternatively, a gate wiring may be separately formed, and then the gate electrodes 621 to 624 may be connected to the gate wiring.

Next, an impurity imparting one conductivity type is added to the island-like semiconductor films 611 to 613. In this adding step, the island-like semiconductor film 614 and the gate electrode 624, i.e. a region to be a p-channel TFT 694, is covered with a resist 618, and the impurity imparting one conductivity type is not added to the island-like semiconductor film 614.

As the impurity imparting one conductivity type, phosphorus (P) or arsenic (As) may be used when using an impurity imparting n-type conductivity. When using an impurity imparting p-type conductivity, boron (B) may be used.

In this embodiment mode, first, as a first adding step, an impurity imparting n-type conductivity is added to the island-like semiconductor films 611 to 613 (FIG. 12D). Specifically, phosphorus (P) is introduced into the island-like semiconductor films 611 to 613 using phosphine ($PH_3$), with an application voltage of 40 to 120 keV, and a dose amount of $1\times10^{13}$ to $1\times10^{15}$ cm$^{-2}$. In this embodiment mode, phosphorus is added into the island-like semiconductor films 611 to 613 using phosphine, with an application voltage of 60 keV and a dose amount of $2.6\times10^{-13}$ cm$^{-2}$. At the time of this introduction of the impurity, regions to be channel forming regions 631, 641, and 651 are determined.

Then, insulating films, or sidewalls 626 to 629, are formed so as to cover side surfaces of the gate electrodes 621 to 624, as shown in FIG. 13A. In other words, the sidewalls 626 (626a and 626b) are formed on the side surfaces of the gate electrode 621, the sidewalls 627 (627a and 627b) are formed on the side surfaces of the gate electrode 622, the sidewalls 628 (628a and 628b) are formed on the side surfaces of the gate electrode 623, and the sidewalls 629 (629a and 629b) are formed on the side surfaces of the gate electrode 624.

The sidewalls 626 to 629 can be formed from an insulating film including silicon by a plasma CVD method or a low pressure CVD (LPCVD) method. In this embodiment mode, taper-shaped sidewalls 626 to 629 are formed by formation of a silicon oxide film with a film thickness of 50 to 200 nm, preferably 100 nm by a plasma CVD method, and etching of the silicon oxide film. Alternatively, the sidewalls 626 to 629 may be formed using a silicon oxide film containing nitrogen.

Also, end portions of the sidewalls 626 to 629 need not necessarily have a taper shape, and they may have a rectangular shape.

Next, as shown in FIG. 13B, a resist 616 is formed to cover the island-like semiconductor film 614, the gate electrode 624, and the sidewalls 629, which are a region later to be the p-channel TFT 694.

Further, as a second adding step, phosphorus (P) is introduced into the island-like semiconductor films 611 to 613 using phosphine ($PH_3$), with an application voltage of 10 to 50 keV, for example 20 keV, and a dose amount of $5.0\times10^{14}$ to $2.5\times10^{16}$ cm$^{-2}$, for example $3.0\times10^{15}$ cm$^{-2}$.

As the second adding step, using the gate electrode 621 and the sidewalls 626 as masks, phosphorus is introduced into the island-like semiconductor film 611; accordingly, a region 633, which is one of a source region and a drain region, a region 634 which is the other of the source region and the drain region, and low-concentration impurity regions 632a and 632b are formed in the island-like semiconductor film 611. Similarly, using the gate electrode 622 and the sidewalls 627 as masks, phosphorus is introduced into the island-like semiconductor film 612, and a region 643, which is one of a source region and a drain region, a region 644, which is the other of the source region and the drain region, and low-concentration impurity regions 642a and 642b are formed in the island-like semiconductor film 612. Further, using the gate electrode 623 and the sidewalls 628 as masks, phosphorus is introduced into the island-like semiconductor film 613, and a region 653, which is one of a source region and a drain region, a region 654, which is the other of the source region and the drain region, and low-concentration impurity regions 652a and 652b are formed in the island-like semiconductor film 613.

In this embodiment mode, phosphorus (P) is included in the regions 633 and 634, which are the source region and the drain region of an n-channel TFT 691, the regions 643 and 644, which are the source region and the drain region of an n-channel TFT 692, and the regions 653 and 654, which are the source region and the drain region of an n-channel TFT 693, at a concentration of $1\times10^{19}$ to $5\times10^{21}$ cm$^{-3}$.

Also, phosphorus (P) is included at a concentration of $1\times10^{18}$ to $5\times10^{19}$ cm$^{-3}$ in the low-concentration impurity regions 632a and 632b of the n-channel TFT 691, the low-concentration impurity regions 642a and 642b of the n-channel TFT 692, and the low-concentration impurity regions 652a and 652b of the n-channel TFT 693.

Then, the resist 616 is removed, and a resist 617 is formed covering the island-like semiconductor films 611 to 613, the gate electrodes 621 to 623, and the sidewalls 626 to 628, that is a region to be the n-channel TFTs 691 to 693.

In order to form the p-channel TFT 694, an impurity imparting the opposite conductivity type to the above-described impurity imparting one conductivity type, that is an impurity imparting p-type conductivity is added to the island-like semiconductor film 614. Specifically, using diborane ($B_2H_6$), boron (B) is introduced into the island-like semiconductor film 614 under a condition in which an application voltage is 60 to 100 keV, for example, 80 keV, and a dose amount is $1\times10^{13}$ to $5\times10^{15}$ cm$^{-2}$, for example, $3\times10^{15}$ cm$^{-2}$. Consequently, regions 663 and 664 which are a source region and a drain region of the p-channel TFT are formed, and in addition, a channel forming region 661 is formed with this introduction of the impurity (FIG. 13C).

Note that with regard to introduction of boron into the p-channel TFT 694, since application voltage is high, a sufficient amount of boron for forming the region 663 and the region 664 is added to the island-like semiconductor film 614 even through the sidewalls 629 and the gate insulating film 615.

In the regions 663 and 664 which are the source region and the drain region of the p-channel TFT 694, boron (B) is included at a concentration of $1 \times 10^{19}$ to $5 \times 10^{21}$ cm$^{-3}$.

Next, the resist 617 is removed, and a first interlayer insulating film 671 is formed so as to cover the island-like semiconductor films 611 to 614, the gate insulating film 615, the gate electrodes 621 to 624, and the sidewalls 626 to 629.

As the first interlayer insulating film 671, an insulating film containing silicon, for example, a silicon oxide film, a silicon nitride film, or a silicon oxide film containing nitrogen, or stacked films thereof is formed by a plasma CVD method or a sputtering method. Of course, the first interlayer insulating film 671 is not limited to the silicon oxide film containing nitrogen, the silicon nitride film, or the stacked film thereof, and other insulating film containing silicon may be used in a single-layer or stacked-layer structure.

In this embodiment mode, a silicon oxide film containing nitrogen is formed to have a thickness of 50 nm by a plasma CVD method, and an impurity is activated by a laser irradiation method. Alternatively, after forming the silicon oxide film containing nitrogen, the impurity may be activated by heating in a nitrogen atmosphere at 550° C. for four hours.

Next, a silicon nitride film is formed to have a thickness of 100 nm by a plasma CVD method, and a silicon oxide film is additionally formed to have a thickness of 600 nm. These stacked layers of the silicon oxide film containing nitrogen, the silicon nitride film, and the silicon oxide film are the first interlayer insulating film 671.

Then, the entire substrate is heated at 410° C. for one hour, and hydrogenation is carried out by releasing hydrogen from the silicon nitride film.

Next, a second interlayer insulating film 672 is formed so as to cover the first interlayer insulating film 671 (FIG. 14A).

For the second interlayer insulating film 672, an inorganic material such as an oxide of silicon or nitride of silicon can be used by using a CVD method, a sputtering method, an SOG (Spin On Glass) method, or the like. In this embodiment mode, a silicon oxide film is formed as the second interlayer insulating film 672.

An insulating film using siloxane may be formed as the second interlayer insulating film 672. The siloxane has a skeletal structure including a bond of silicon (Si) and oxygen (O), and an organic group containing at least hydrogen (for example, an alkyl group or aromatic hydrocarbon) is used for a substituent. Alternatively, a fluoro group may be used for the substituent. Further, the organic group containing at least hydrogen and the fluoro group may be used for the substituent.

A third interlayer insulating film may be formed over the second interlayer insulating film 672. As the third interlayer insulating film, a film that does not easily allow penetration of moisture, oxygen, and the like compared to other insulating films may be formed. Typically, a silicon nitride film, a silicon oxide film, a silicon nitride film containing oxygen, a silicon oxide film containing nitrogen, a thin film mainly containing carbon (for example, a diamong-like carbon (DLC) film or a carbon nitride (CN) film), or the like which is obtained by a sputtering method or a CVD method, can be used.

Next, contact holes for electrical connection to the island-like semiconductor films 611, 612, 613, and 614 are formed in the interlayer insulating films 671 and 672 with a stepper apparatus or the like.

In the interlayer insulating films 671 and 672, a contact hole 673 reaching the region 633 of the island-like semiconductor film 611, a contact hole 674 reaching the region 644 of the island-like semiconductor film 612, a contact hole 676 reaching the region 653 of the island-like semiconductor film 613, a contact hole 677 reaching the region 654 of the island-like semiconductor film 613, a contact hole 678 reaching the region 663 of the island-like semiconductor film 614, and a contact hole 679 reaching the region 664 of the island-like semiconductor film 614 are formed (FIG. 14B). Note that the contact hole 673 and the contact hole 674 may be formed so as to reach the region 634 and the region 643, respectively.

In the TFTs 691 and 692 of the memory cell, the contact holes are formed over either one of the source region and the drain region with a stepper apparatus or the like. In the TFTs 693 and 694 of the logic circuit, the contact holes are formed both over the source region and over the drain region with a stepper apparatus or the like.

Further, the contact hole 673 includes a plurality of contact holes 673a, 673b, and 673c. Similarly, the contact hole 674 includes a plurality of contact holes 674a, 674b, and 674c; the contact hole 676 includes a plurality of contact holes 676a and 676b; the contact hole 677 includes a plurality of contact holes 677a and 677b; the contact hole 678 includes a plurality of contact holes 678a and 678b; and the contact hole 679 includes a plurality of contact holes 679a and 679b. Note that the contact holes 676 to 679 may each include not the plurality of contact holes but one contact hole.

The contact holes 673a, 673b, 673c, 674a, 674b, 674c, 676a, 676b, 677a, 677b, 678a, 678b, 679a, and 679b have the same size.

Further, each of the contact holes 673 and 674 may each have an area of a base which is larger than that of each of the contact holes 676 to 679.

Next, a contact hole 680 reaching the region 634 of the island-like semiconductor film 611 is formed in the interlayer insulating films 671 and 672 with a laser direct drawing apparatus, an electron beam direct drawing apparatus, or the like (FIG. 14C). If needed, a contact hole reaching the region 643 of the island-like semiconductor film 612 may be formed.

At this time, the contact hole 680 is formed so as to have an area of a base which is equal to a sum of areas of bases of the plurality of contact holes included in the contact hole 674.

Figure 10:
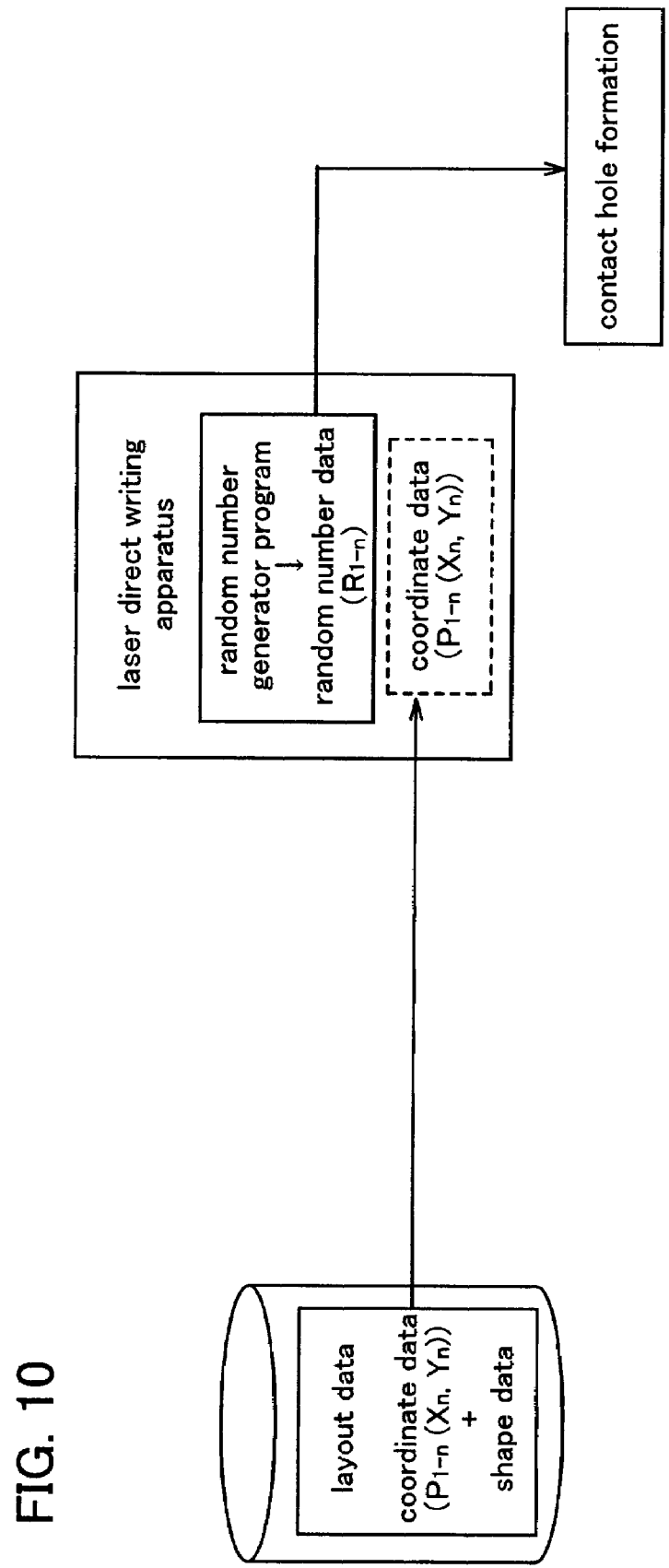
FIG. 10 shows a step of laser light exposure with a laser direct drawing apparatus according to the present invention.
Figure 11:
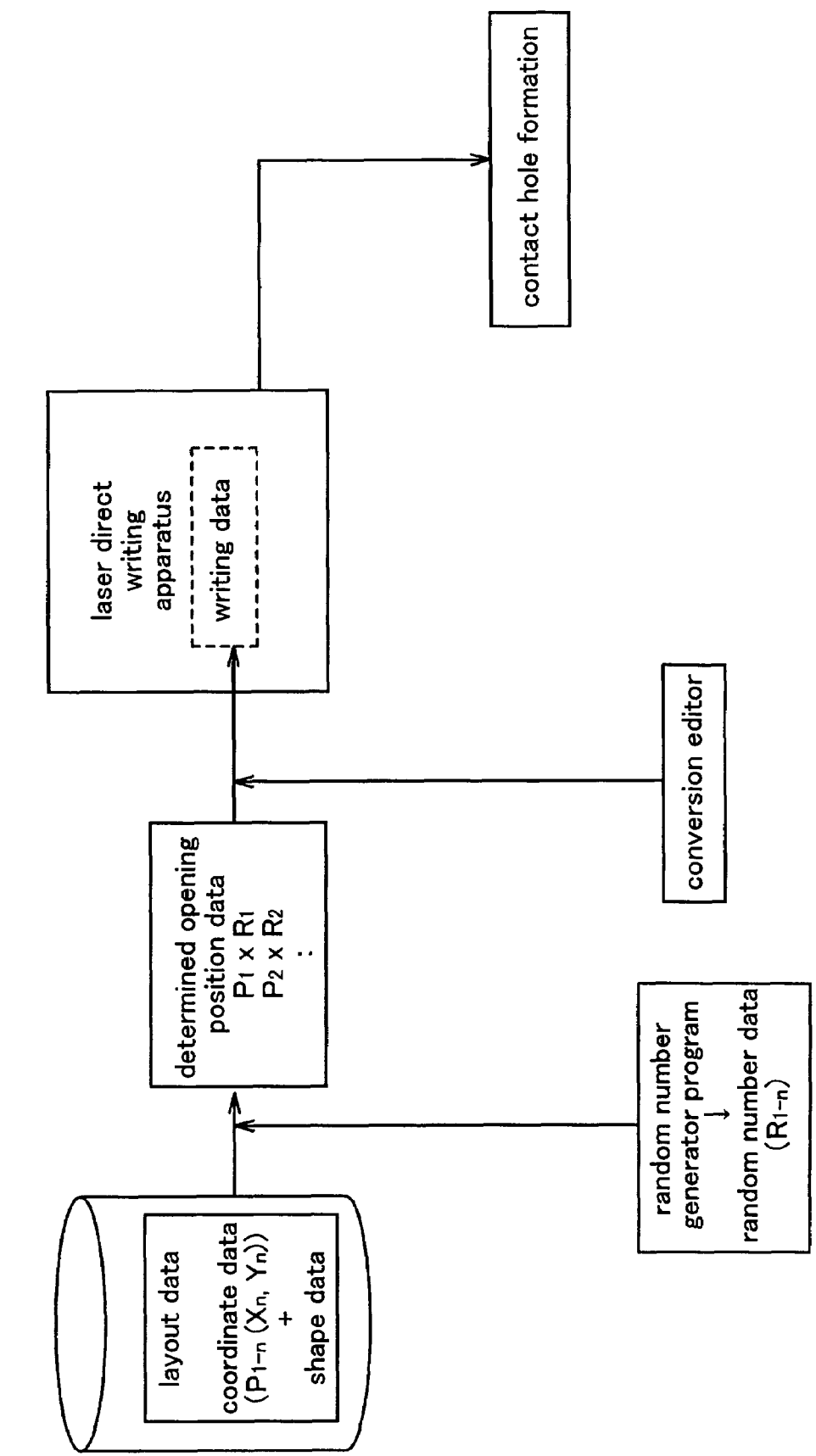
FIG. 11 shows a step of conventional laser light exposure.

FIG. 10 shows a step of laser light exposure by a laser direct drawing apparatus. The laser direct drawing apparatus of this embodiment mode includes a random number generator program in its inside, and it is one feature that the random number generation is performed not outside the apparatus but inside the apparatus. Accordingly, the step of laser light exposure for forming the contact hole 680 can be shortened.

When layout data including coordinate data and shape data is transmitted to the laser direct drawing apparatus, the layout data is combined with random number data which is created by the laser direct drawing apparatus, so that coordinate data is formed.

Based on this coordinate data, it is determined which TFT of the memory cell in which to form the contact hole 680. For example, the contact hole 680 is formed in the TFT 691, but a contact hole like the contact hole 680 is not formed in the TFT 692.

Figure 15:
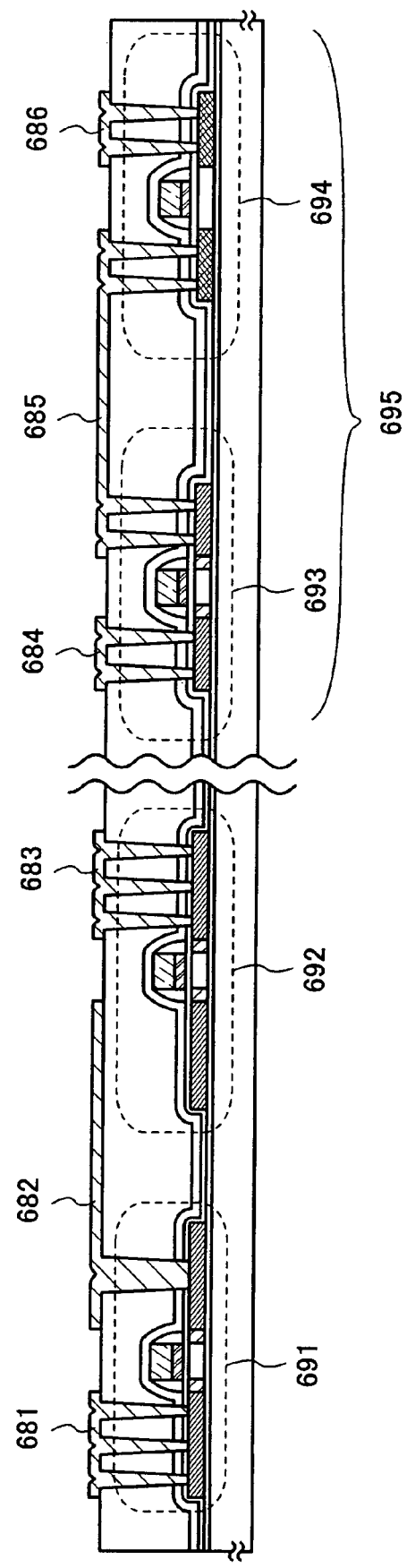
FIG. 15 is a cross sectional view of a semiconductor device of the present invention.

Then, over the second interlayer insulating film 672, a conductive film is formed, and using the conductive film, source electrodes and drain electrodes 681, 682, 683, 684, 685, and 686 are formed (FIG. 15).

The electrode 681, which is one of the source electrode and the drain electrode of the TFT 691, is electrically connected to the region 633, and the electrode 682, which is the other of the source electrode and the drain electrode, is electrically connected to the region 634. The electrode 683, which is one of the source electrode and the drain electrode of the TFT 692, is electrically connected to the region 644. Alternatively, the electrode 683 may be electrically connected to not the region 644 but the region 643.

The electrode 684, which is one of the source electrode and the drain electrode of the TFT 693, is electrically connected to the region 653. The electrode 685, which is the other of the source electrode and the drain electrode of the TFT 693 and which is one of the source electrode and the drain electrode of the TFT 694, is electrically connected to the region 654 and the region 663. The electrode 686, which is the other of the source electrode and the drain electrode of the TFT 694, is electrically connected to the region 664. Thus, TFTs 693 and 694 form a CMOS circuit 695.

In this embodiment mode, the electrodes 681 to 686 are formed by a CVD method, a sputtering method, or the like using an element such as aluminum (Al), tungsten (W), titanium (Ti), tantalum (Ta), molybdenum (Mo), nickel (Ni), cobalt (Co), iron (Fe), platinum (Pt), copper (Cu), gold (Au), silver (Ag), manganese (Mn), neodymium (Nd), carbon (C), or silicon (Si), or an alloy material or a compound material containing the above element as its main component, with a single layer structure or a stacked structure. An alloy material containing aluminum as its main component corresponds to, for example, a material containing nickel, whose main component is aluminum, or an alloy material containing nickel and one or both of carbon and silicon, whose main component is aluminum. For the electrodes 681 to 686, for example, a stacked structure of a barrier film, an aluminum-silicon (Al—Si) film, and a barrier film, or a stacked structure of a barrier film, an aluminum-silicon (Al—Si) film, a titanium nitride (TiN) film, and a barrier film may be preferably employed. It is to be noted that the barrier film corresponds to a thin film formed using titanium, a nitride of titanium, molybdenum, or a nitride of molybdenum. Aluminum and aluminum silicon which have a low resistance and are inexpensive are optimal materials for forming the electrodes 681 to 686. In addition, an aluminum alloy film can prevent interdiffusion between silicon and aluminum even when being in contact with silicon. In addition, generation of a hillock of aluminum or aluminum silicon can be prevented when upper and lower barrier layers are provided.

In this embodiment mode, the electrodes 681 to 686 are formed using stack layers of a titanium (Ti) film, a titanium nitride film, an aluminum (Al) film, and a titanium (Ti) film, which are 60 nm, 50 nm, 500 nm, and 100 nm, respectively.

The electrodes 681 to 686 may be formed by using the same material and the same process as those of a wiring, or the electrodes and the wiring may be separately formed and then may be connected.

Note that the TFT 691 in FIG. 15 and the TFT 118 in FIG. 7 are the same, the TFT 692 in FIG. 15 and the TFT 119 in FIG. 7 are the same, the TFT 693 in FIG. 15 and the TFT 411 in FIG. 9 are the same, and the TFT 694 in FIG. 15 and the TFT 421 in FIG. 9 are the same. In the case of forming the TFTs 118 and 119 of the memory cell array shown in FIG. 7 and the TFTs 411 and 421 of the logic circuit shown in FIG. 9 over the same substrate, each TFT may be formed in accordance with the manufacturing process shown in FIG. 10, FIGS. 12A to 12D, FIGS. 13A to 13C, FIGS. 14A to 14C, and FIG. 15. Alternatively, the TFTs of the memory cell and the TFTs of the logic circuit may be formed over different substrates and then may be electrically connected to each other using a wiring. In FIG. 7, the base film has two layers. In FIG. 9, FIGS. 12A to 12D, FIGS. 13A to 13C, FIGS. 14A to 14C, and FIG. 15, the base film has one layer. However, the number of layers may be determined according to need.

In this embodiment mode, individual data such as an ID number is determined depending on whether to form a contact hole by laser light exposure or the like with a laser direct drawing apparatus or the like. Therefore, individual data such as an ID number can be easily given to an individual semiconductor device capable of wireless communication with the use of an IC.

Further, a random number generator program is included inside the laser direct drawing apparatus, and therefore random number data can be formed in the laser direct drawing apparatus. Accordingly, a manufacturing process of a semiconductor device capable of wireless communication with the use of an IC can be shortened.

Embodiment Mode 2

In Embodiment Mode 2, a semiconductor device capable of wireless communication with the use of an IC, which includes a mask ROM having a structure different from that of Embodiment Mode 1 will be described with reference to FIG. 16 and FIG. 17. Embodiment Mode 1 may be incorporated into a detailed manufacturing process of this embodiment mode.

Figure 16:
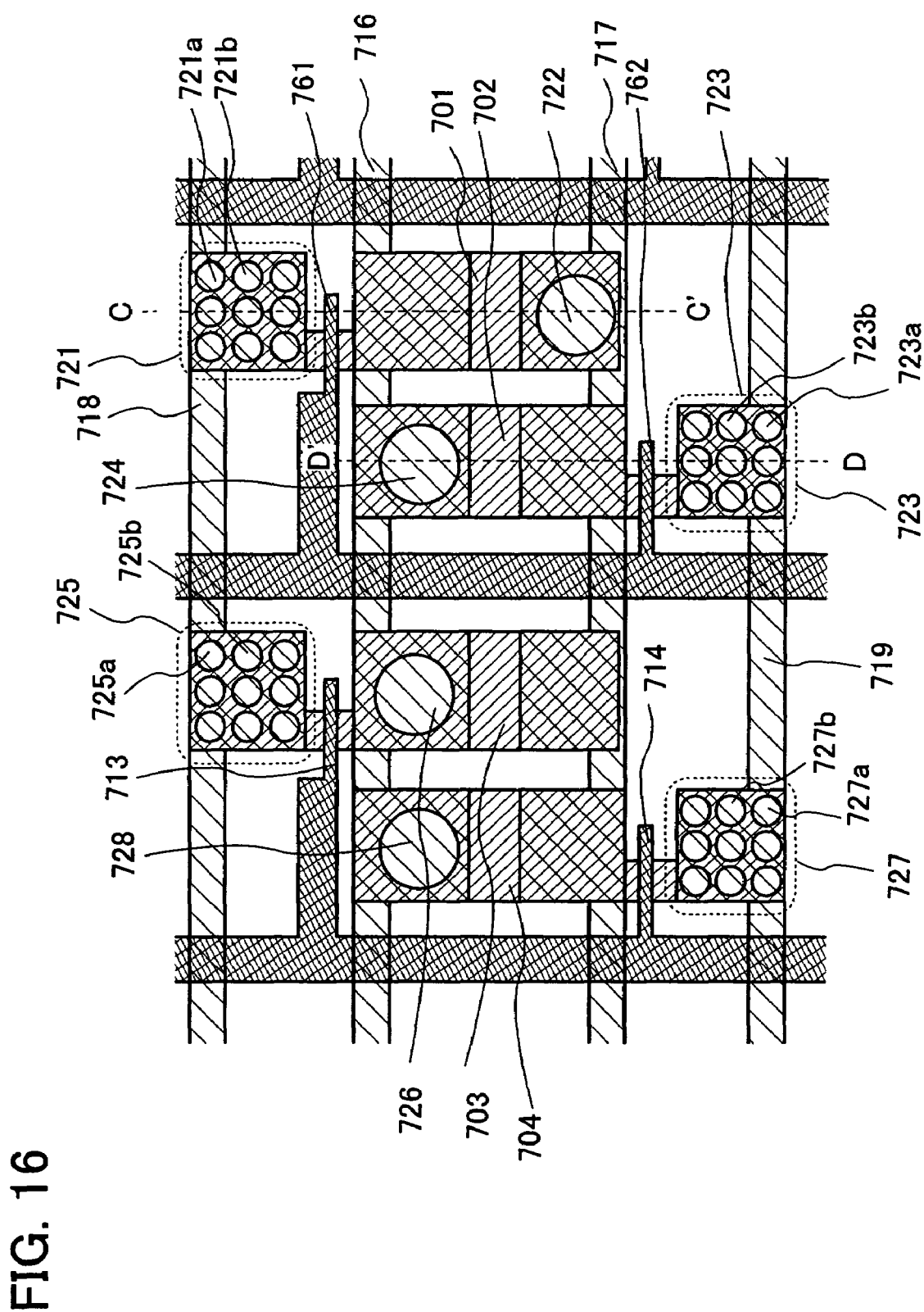
FIG. 16 is a top view of a semiconductor device of the present invention.
Figure 17:
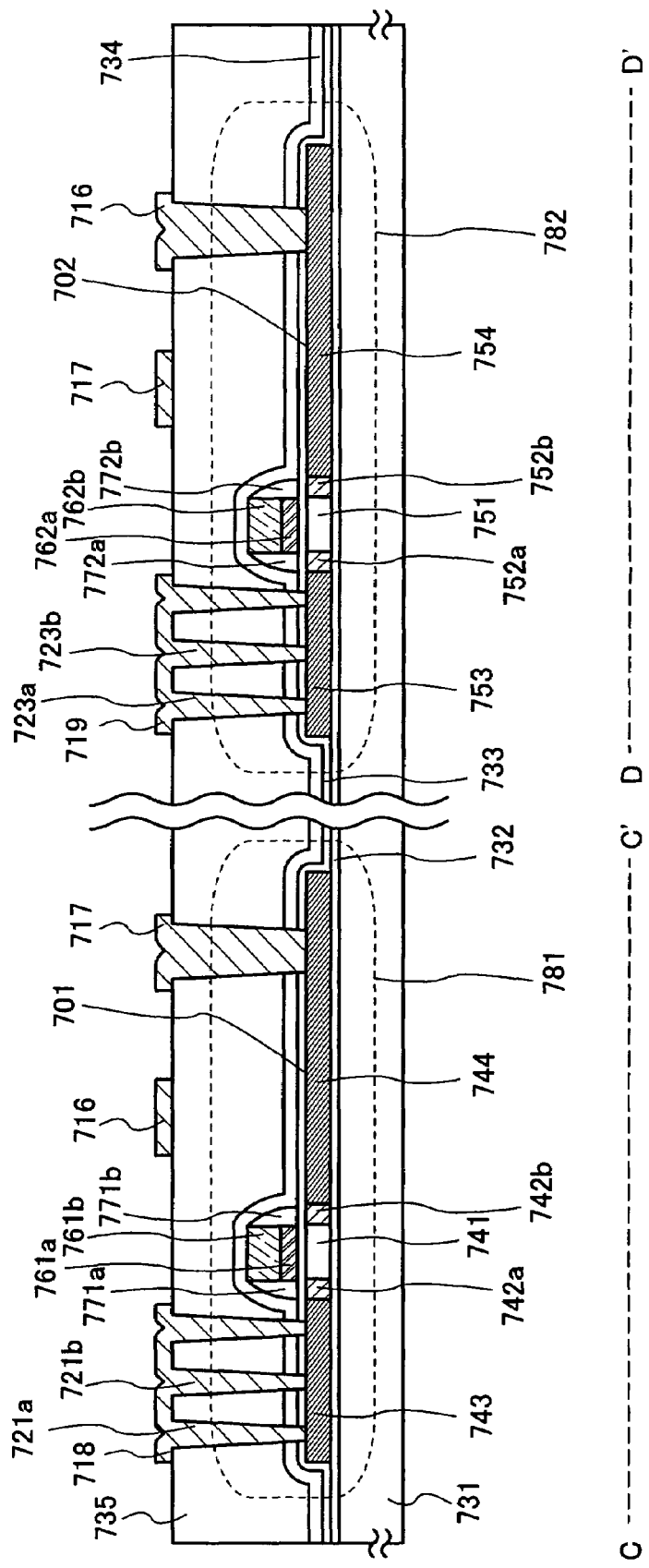
FIG. 17 is a cross sectional view of a semiconductor device of the present invention.

FIG. 16 is a top view of this embodiment mode, and FIG. 17 is a cross sectional view taken along a line C-C' and a line D-D' in FIG. 16. Note, while thin film transistors having a top gate configuration are shown, they may also have a bottom gate configuration instead of the top gate configuration.

In Embodiment Mode 1, the individual data such as an ID number is determined by whether to form the contact hole 141 and the contact hole 680, which are formed with a laser direct drawing apparatus or the like. However, in this embodiment mode, contact holes formed with a laser direct drawing apparatus or the like are formed in all TFTs of a memory cell. Individual data such as an ID number of a semiconductor device including the memory cell array is formed depending on which one of two power supply lines is electrically connected to either one of a source region and a drain region of a TFT through a contact hole formed with a laser direct drawing apparatus or the like.

In the semiconductor device capable of wireless communication with the use of an IC shown in FIG. 16 and FIG. 17, a base film 732 is formed over a substrate 731, and TFTs 781 and 782 are formed thereover. The TFT 781 includes an island-like semiconductor film 701 including a channel forming region 741, low-concentration impurity regions 742a and 742b, a region 743, which is one of a source region and a drain region, and a region 744, which is the other of the source region and the drain region; a gate insulating film 733; and a gate electrode 761 including a lower-layer gate electrode 761a and an upper-layer gate electrode 761b. The TFT 782 includes an island-like semiconductor film 702 including a channel forming region 751, low-concentration impurity regions 752a and 752b, a region 753 which is one of a source region and a drain region, and a region 754 which is the other of the source region and the drain region; the gate insulating film 733; and a gate electrode 762 including a lower-layer gate electrode 762a and an upper-layer gate electrode 762b. Note that the gate electrodes 761 and 762 are electrically connected to the same word line. The gate electrodes and the word line may be formed by using the same material and the same process, or may be separately formed by using different materials and different processes and then may be electrically connected to each other.

On side surfaces of the gate electrode 761, sidewalls 771a and 771b are formed. On side surfaces of the gate electrode 762, sidewalls 772a and 772b are formed.

Over the TFTs 781 and 782, a first interlayer insulating film 734 and a second interlayer insulating film 735 are formed.

Over the region 743 of the TFT 781 in the first interlayer insulating film 734 and the second interlayer insulating film 735, a contact hole 721 including a plurality of contact holes 721a, 721b, and so on, is formed, and over the region 753 of the TFT 782, a contact hole 723 including a plurality of contact holes 723a, 723b, and so on, is formed. The contact holes 721 and 723 are formed with a stepper apparatus or the like.

A bit line 718 is electrically connected to the region 743 of the TFT 781 through the contact hole 721. In addition, a bit line 719 is electrically connected to the region 753 of the TFT 782 through the contact hole 723.

In the first interlayer insulating film 734 and the second interlayer insulating film 735, a contact hole 722 and a contact hole 724 are formed with a laser direct drawing apparatus or the like. In the TFT 781, a power supply line 717 is electrically connected to the region 744 through the contact hole 722. Although a power supply line 716 is also formed over the second interlayer insulating film 734, a contact hole is not formed in the region over which the power supply line 716 is formed, in the first interlayer insulating film 734 and the second interlayer insulating film 735. Therefore, the power supply line 716 is not connected to the region 744.

In the TFT 782, the contact hole 724 is formed in the first interlayer insulating film 734 and the second interlayer insulating film 735 so that the power supply line 716 connects to the region 754. A contact hole is not formed in the region over which the power supply line 717 is formed, in the first interlayer insulating film 734 and the second interlayer insulating film 735. Therefore, the power supply line 717 is not connected to the region 754.

A sum of areas of bases of the plurality of contact holes included in the contact hole 721 is equal to an area of a base of the contact hole 722. Further, a sum of areas of bases of the plurality of contact holes included in the contact hole 723 is equal to an area of a base of the contact hole 724. Thus, in each of the TFTs, a current density of a current flowing through the source region and a current density of a current flowing through the drain region can be made to be equal.

Voltages with different values are applied to the power supply lines 716 and 717. Individual data such as an ID number of a semiconductor device is formed depending on which TFT is connected to the power supply lines 716 or 717.

FIG. 16 shows a TFT including an island-like semiconductor film 703 and a gate electrode 713 and a TFT including an island-like semiconductor film 704 and a gate electrode 714, and these TFTs have a similar structure to those of the TFTs 781 and 782.

A contact hole 725 (725a, 725b, . . . ) and a contact hole 727 (727a, 727b, . . . ) are formed in the interlayer insulating films 734 and 735 with a stepper apparatus or the like. A contact hole 726 and a contact hole 728 are formed in the interlayer insulating films 734 and 735 by laser light exposure or the like with a laser direct drawing apparatus or the like.

A sum of areas of bases of a plurality of contact holes included in the contact hole 725 is equal to an area of a base of the contact hole 726. Further, a sum of areas of bases of a plurality of contact holes included in the contact hole 727 is equal to an area of a base of the contact hole 728.

This embodiment mode can be implemented with a combination of any description in other embodiment modes and embodiments if needed.

Embodiment Mode 3

Embodiment Mode 3 will describe a manufacturing method of a semiconductor device capable of wireless communication with the use of an IC, which is different from those in Embodiment Modes 1 and 2 with reference to FIGS. 18A and 18B, FIGS. 19A and 19B, and FIG. 20. In this embodiment mode, components which are the same as those in Embodiment Mode 1 are denoted by the same reference numerals. Note, while thin film transistors having a top gate configuration are shown, they may also have a bottom gate configuration instead of the top gate configuration.

First, in accordance with the description in Embodiment Mode 1, a semiconductor device shown in FIG. 15 is manufactured. Note that instead of the base film 602, a separation layer 802, a first base film 803, and a second base film 804 are formed.

The separation layer 802 is formed of an amorphous semiconductor film, a polycrystalline semiconductor film, or a semi-amorphous semiconductor film. For example, a layer mainly containing silicon such as amorphous silicon, polycrystalline silicon, single-crystalline silicon, or semi-amorphous silicon. The separation layer 802 can be formed by a sputtering method, a plasma CVD method, or the like. In this embodiment mode, the separation layer 802 is formed of amorphous silicon in approximately 500 nm thick by a sputtering method.

Note that a semi-amorphous semiconductor film (hereinafter also referred to as a SAS film) includes a semiconductor which has a structure intermediate between an amorphous semiconductor film and a semiconductor film having a crystalline structure (including single-crystalline and polycrystalline structures). The semi-amorphous semiconductor film has a third state which is stable in terms of free energy and is a crystalline substance having short-range order and lattice distortion. The crystal grain of which the size is 0.5 to 20 nm can exist by being dispersed in a non-single crystalline semiconductor film. The peak of the Raman spectrum of a semi-amorphous semiconductor film is shifted to be lower than the frequency of 520 cm$^{-1}$, and the diffraction peaks of (111) and (220) that are thought to be caused by an Si crystal lattice are observed by X-ray diffraction. In addition, the semi-amorphous semiconductor film contains hydrogen or halogen of at least 1 atomic % or more to terminate a dangling bond. In this specification, such a semiconductor film is referred to as a semi-amorphous semiconductor (SAS) film for the sake of convenience. Moreover, a rare gas element such as helium, argon, krypton, or neon may be contained therein to further promote lattice distortion so that stability is enhanced and a favorable semi-amorphous semiconductor film can be obtained. Note that a microcrystalline semiconductor film (microcrystal semiconductor film) is also included in the semi-amorphous semiconductor film.

In addition, the SAS film can be obtained by glow discharge decomposition of a gas containing silicon. For a typical gas containing silicon, $SiH_4$ is given, and, in addition, $Si_2H_6$, $SiH_2Cl_2$, $SiHCl_3$, $SiCl_4$, $SiF_4$, or the like can be used. The gas containing silicon may be diluted with hydrogen or with a gas in which one or more of rare gas elements of helium, argon, krypton, and neon are added to hydrogen; therefore, the SAS film can be easily formed. It is preferable that the gas containing silicon be diluted at a dilution rate set to be in the range of 2 to 1000 times. Further, a carbide gas such as $CH_4$ or $C_2H_6$, a germanium gas such as $GeH_4$ or $GeF_4$, $F_2$, or the like may be mixed into the gas containing silicon so as to adjust the energy bandwidth to be from 1.5 to 2.4 eV or 0.9 to 1.1 eV.

Each of the base films 803 and 804 includes an insulating film such as a silicon oxide film, a silicon nitride film, a silicon nitride film containing oxygen, or a silicon oxide film containing nitrogen. In this embodiment mode, a silicon nitride film containing oxygen with a thickness of 10 to 200 nm as the first base film 803 and a silicon oxide film containing nitrogen with a thickness of 50 to 200 nm as the second base film 804 are sequentially stacked and formed.

In accordance with the description in Embodiment Mode 1, the process up to formation of electrodes 681 to 686 is performed. Then, a third interlayer insulating film 806 is formed over a second interlayer insulating film 672 and electrodes 811 to 816 functioning as antennas are formed. The electrodes 811 to 816 functioning as the antennas are formed of a conductive material by a CVD method, a sputtering method, a printing method such as screen printing or gravure printing, a droplet discharge method, a dispenser method, a plating method, or the like. The conductive material may be an element of aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing the element as its main component, and formed using a single layer structure or a stacked structure.

Figures 18A, 18B:
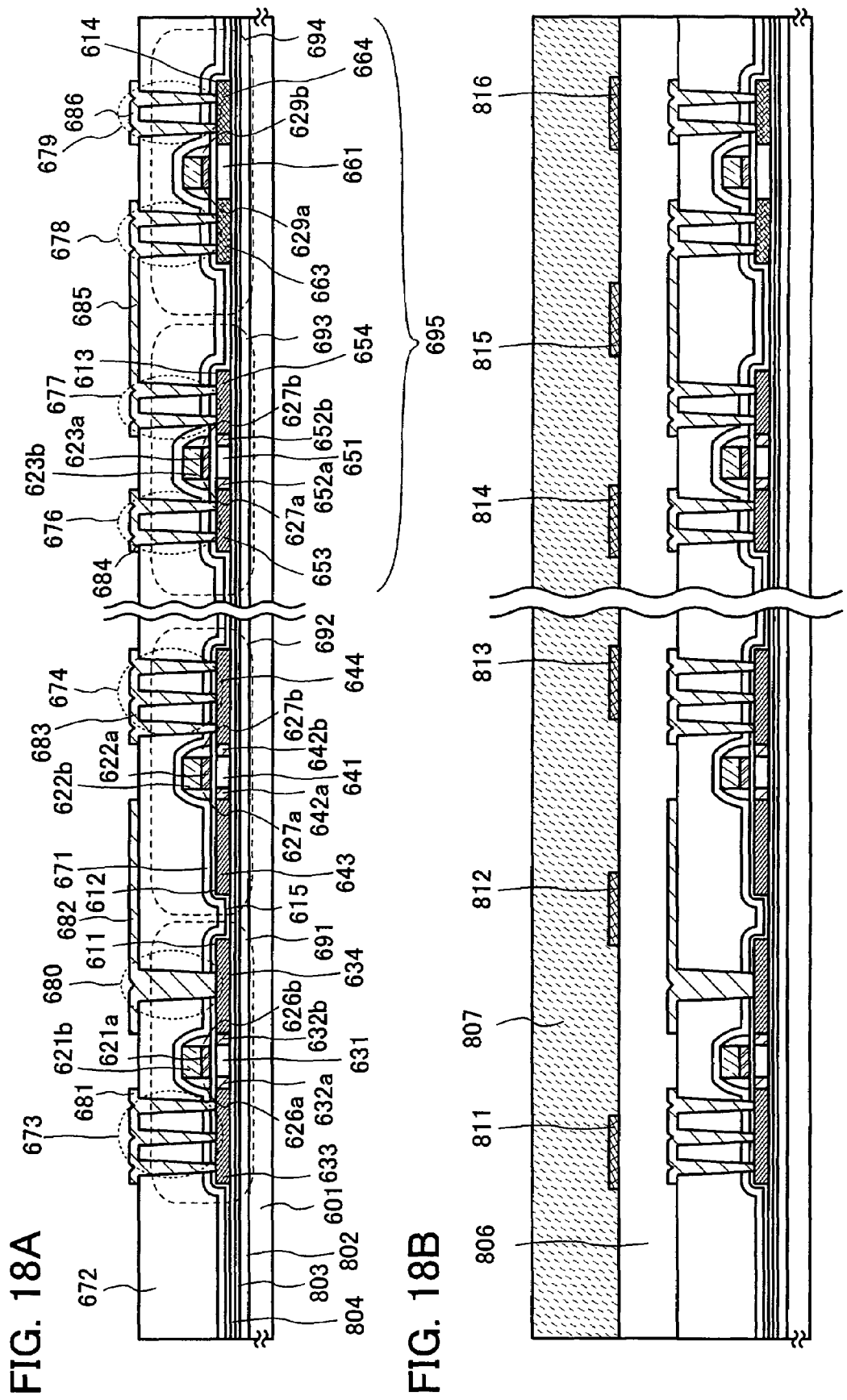
FIGS. 18A and 18B are cross sectional views showing a manufacturing process of a semiconductor device of the present invention.

A protective layer 807 is formed over the third interlayer insulating film 806 so as to cover the electrodes 811 to 816 functioning as the antennas. As the protective film 807, a material is used which can protect the electrodes 811 to 816 functioning as the antennas when the separation layer 802 is later removed by etching. For example, the protective layer 807 can be formed by application of an epoxy based resin, an acrylate based resin, or a silicon based resin, which is soluble in water or in alcohols, over an entire surface (FIG. 18B).

Next, a groove 808 for separating the separation layer 802 is formed (FIG. 19A). The groove 808 may be formed at least to expose the separation layer 802. The groove 808 can be formed by etching, dicing, scribing, laser irradiation, or the like.

Then, the separation layer 802 is removed by etching (FIG. 19B). In this embodiment mode, halogen fluoride is used as an etching gas which is inlet through the groove 808. In this embodiment mode, for example, etching is performed by using $ClF_3$ (chlorine trifluoride) at 350° C. at a flow rate of 300 sccm with a pressure of 800 Pa for 3 hours. Further, a $ClF_3$ gas mixed with nitrogen may be used as well. By using halogen fluoride such as $ClF_3$, the separation layer 802 is selectively etched so that a substrate 601 can be separated. It is to be noted that halogen fluoride may be either a gas or liquid.

Figure 20:
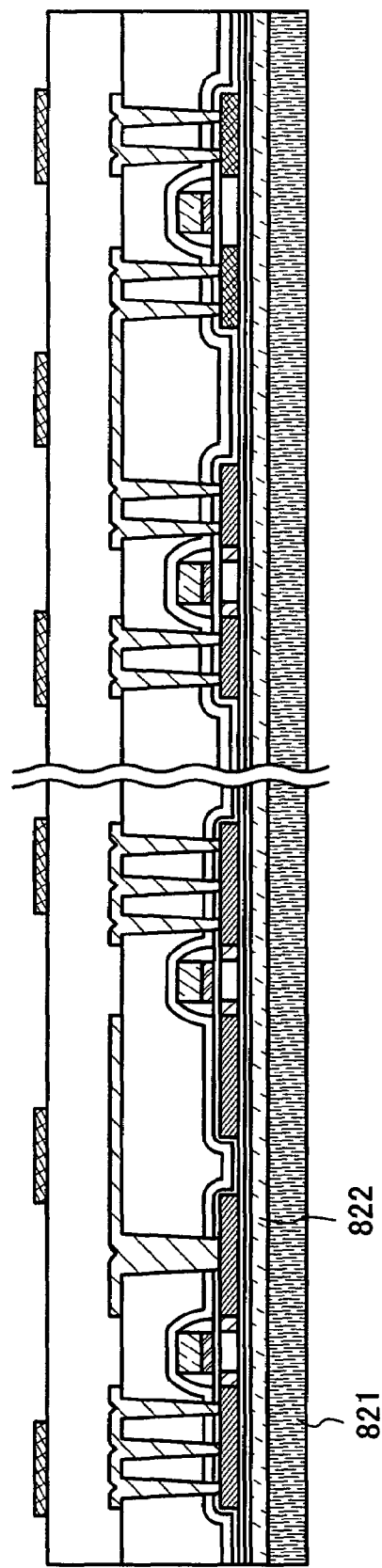
FIG. 20 is a cross sectional view of a semiconductor device of the present invention.

Next, a memory cell array including TFTs 691 and 692 and a logic circuit including TFTs 693 and 694, which are separated, are attached to a support base 821 with an adhesive 822 (FIG. 20). As the adhesive 822, a material capable of attaching the support base 821 to the first base film 803 is used. For example, various curable adhesives such as a reaction curable adhesive, a heat curable adhesive, a light curable adhesive such as an ultraviolet curable adhesive, and an anaerobiotic adhesive can be used as the adhesive 822.

As the support base 821, an organic material such as a flexible paper or plastic can be used. Alternatively, a flexible inorganic material may be used as the support base 821. It is preferable that the support base 821 have a heat conductivity as high as 2 to 30 W/mK for dispersing heat generated at the integrated circuit.

The integrated circuit including the memory cell array and the logic circuit can be separated from the substrate 601 by various methods as well as by etching of a layer mainly containing silicon as described in this embodiment mode. For example, a metal oxide film is provided between a substrate having high heat resistance and the integrated circuit and the metal oxide film is made vulnerable by crystallization, thereby the integrated circuit can be separated. Further, for example, the separation layer is broken by laser light irradiation so that the integrated circuit can be separated from the substrate. Moreover, for example, the substrate over which the integrated circuit is formed can be mechanically removed or removed by etching with a solution or a gas, so that the integrated circuit can be separated from the substrate.

In the case where an object has a curved surface and thus a support base of a semiconductor device which is attached to the curved surface and includes a memory cell array and a logic circuit is bent so as to have a curved surface along a generating line of a conical surface, a columnar surface, or the like, it is preferable that the direction of the generating line and a direction that carriers of a TFT move be the same. By the aforementioned structure, it can be prevented that characteristics of a TFT are affected when the support base is bent. Further, when the island-like semiconductor film occupies 1 to 30% of an area of the integrated circuit, even though the support base is bent, an affect to the characteristics of a TFT can be prevented.

Through the above-described manufacturing process, a semiconductor device capable of wireless communication with the use of an IC according to the present invention is manufactured.

In this embodiment mode, the antennas are formed over the substrate over which the semiconductor device is formed. However, after formation of a semiconductor device, an antenna may be formed by a printing method over a substrate over which the semiconductor device is formed. Alternatively, an antenna may be separately formed over a substrate which is different from a substrate over which a semiconductor device is formed, and the substrate over which the semiconductor device is formed and the substrate over which the antenna is formed may be attached to each other, so that the semiconductor device may be electrically connected to the antenna.

Figure 23:
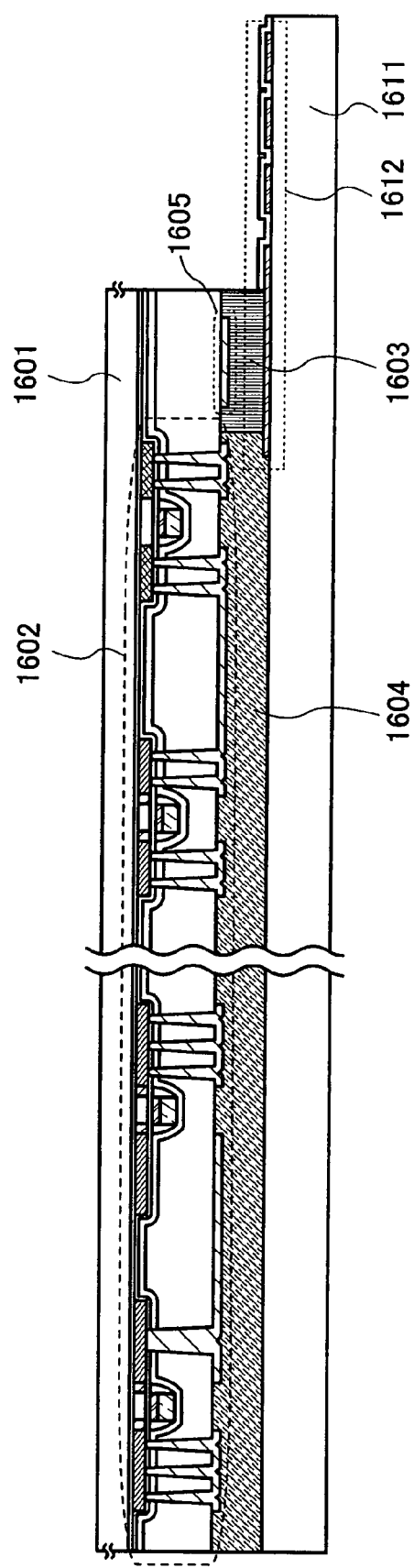
FIG. 23 is a cross sectional view of a semiconductor device of the present invention.

An example of separately forming an antenna over a substrate which is different from a substrate over which a semiconductor device is formed, attaching the substrate over which the semiconductor device is formed to the substrate over which the antenna is formed, and electrically connecting the semiconductor device to the antenna will be described with reference to FIG. 23 and FIG. 21.

Over a substrate 1601 over which a semiconductor device 1602 including a memory cell array and a logic circuit is provided, a terminal portion 1605 including a terminal electrode and the like is provided.

Then, the terminal portion 1605 is electrically connected to an antenna 1612 which is provided over a substrate 1611 which is different from the substrate 1601. The substrate 1601 and the substrate 1611 over which the antenna 1612 is formed are attached so as to connect to the terminal portion 1605. A conductive particle 1603 and a resin 1604 are provided between the substrate 1601 and the substrate 1611. With the conductive particle 1603, the antenna 1612 and the terminal portion 1605 are electrically connected. Note that the antenna 1612 shown in FIG. 23 is equivalent to an antenna 917 shown in FIG. 21, and the antenna 1612 and the antenna 917 are electrically connected to a ground potential (GND), and circuits such as a power supply circuit 915 and a high-frequency circuit 914.

This embodiment mode can be implemented with a combination of any of the above-described embodiment modes and other embodiments.

Embodiment 1

Figure 2:
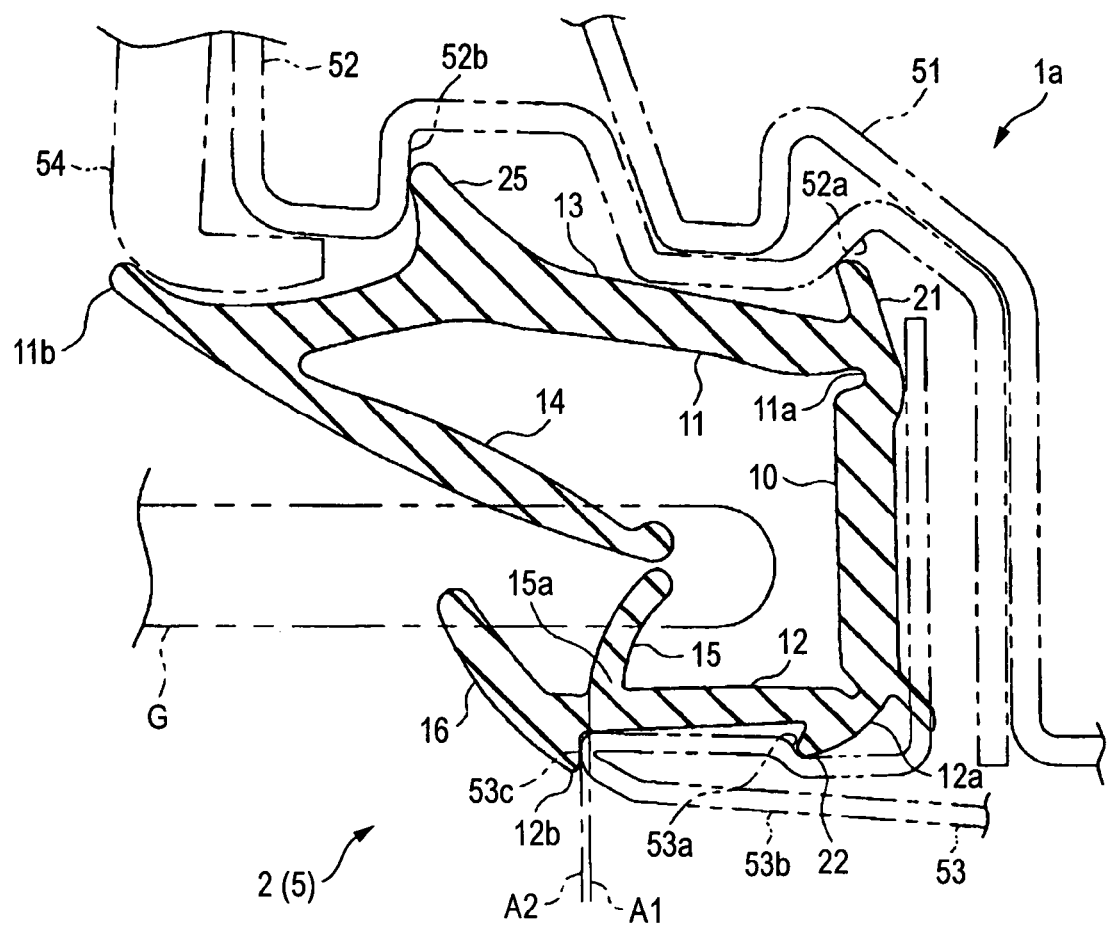
FIG. 2 is a schematic view of an individual recognition system.
Figure 3:
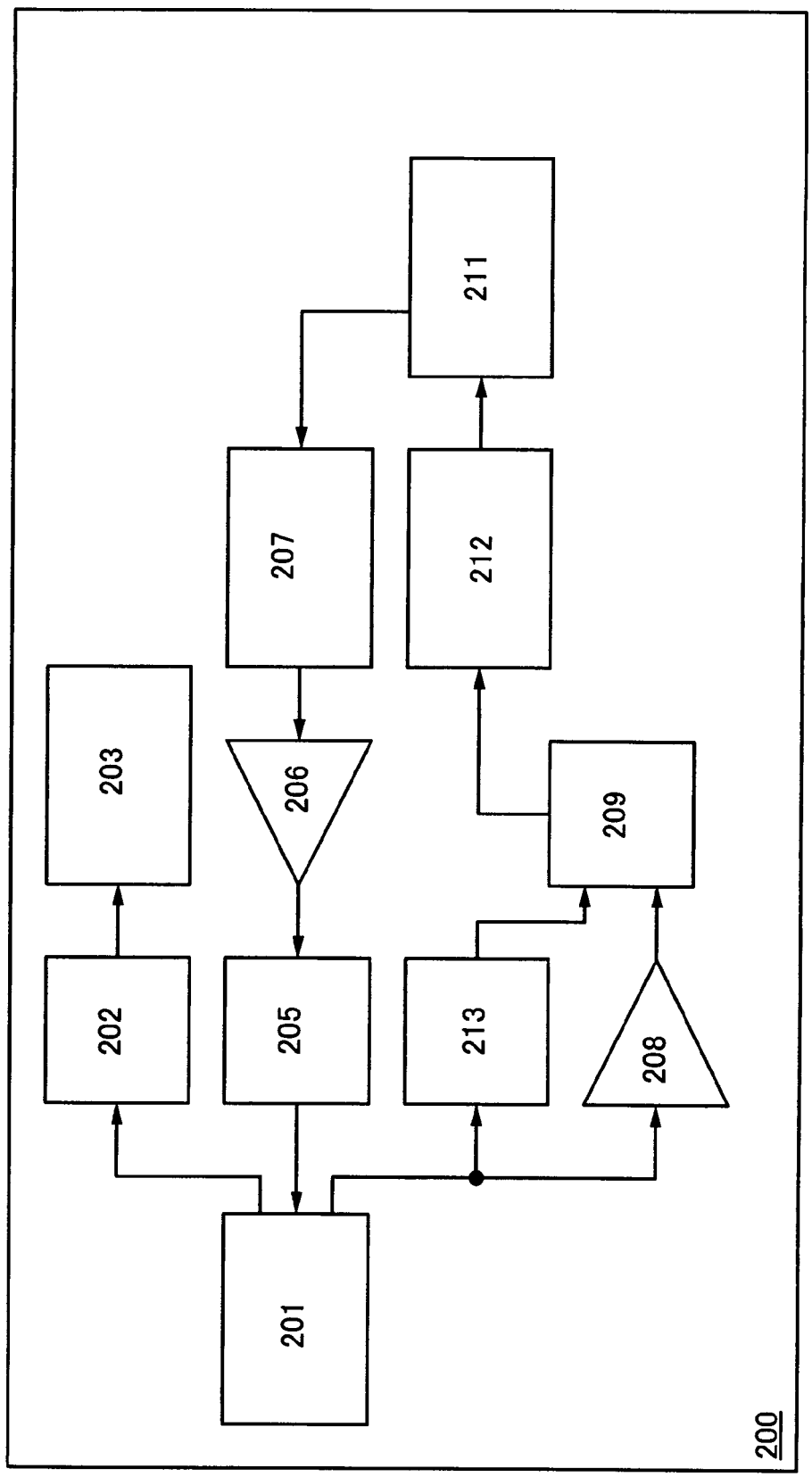
FIG. 3 is a block diagram showing a structure of a conventional semiconductor device.
Figure 4A:
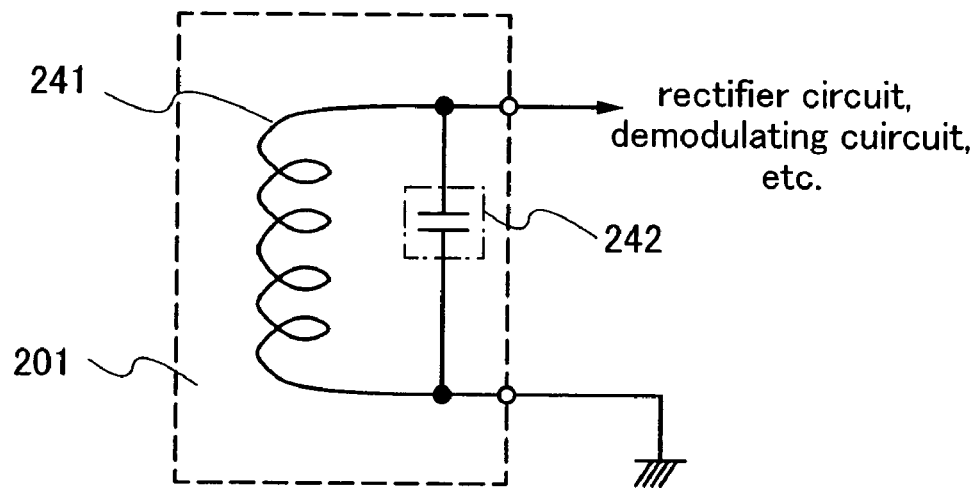
FIGS. 4A and 4B are block diagrams showing structures of a conventional semiconductor device.
Figure 4B:
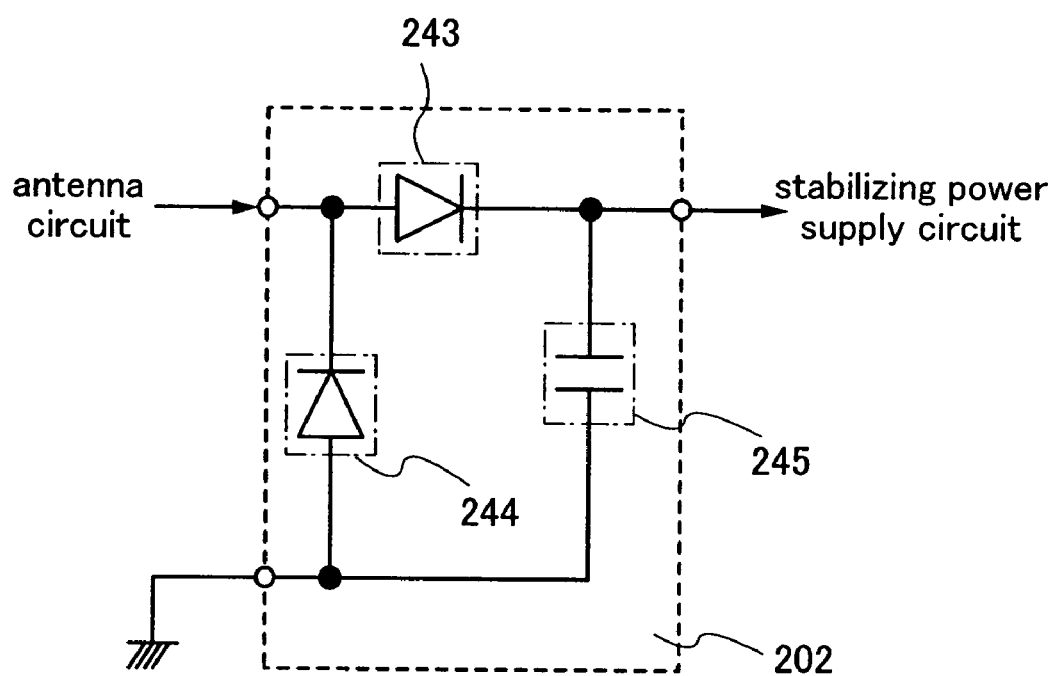
Figure 6:
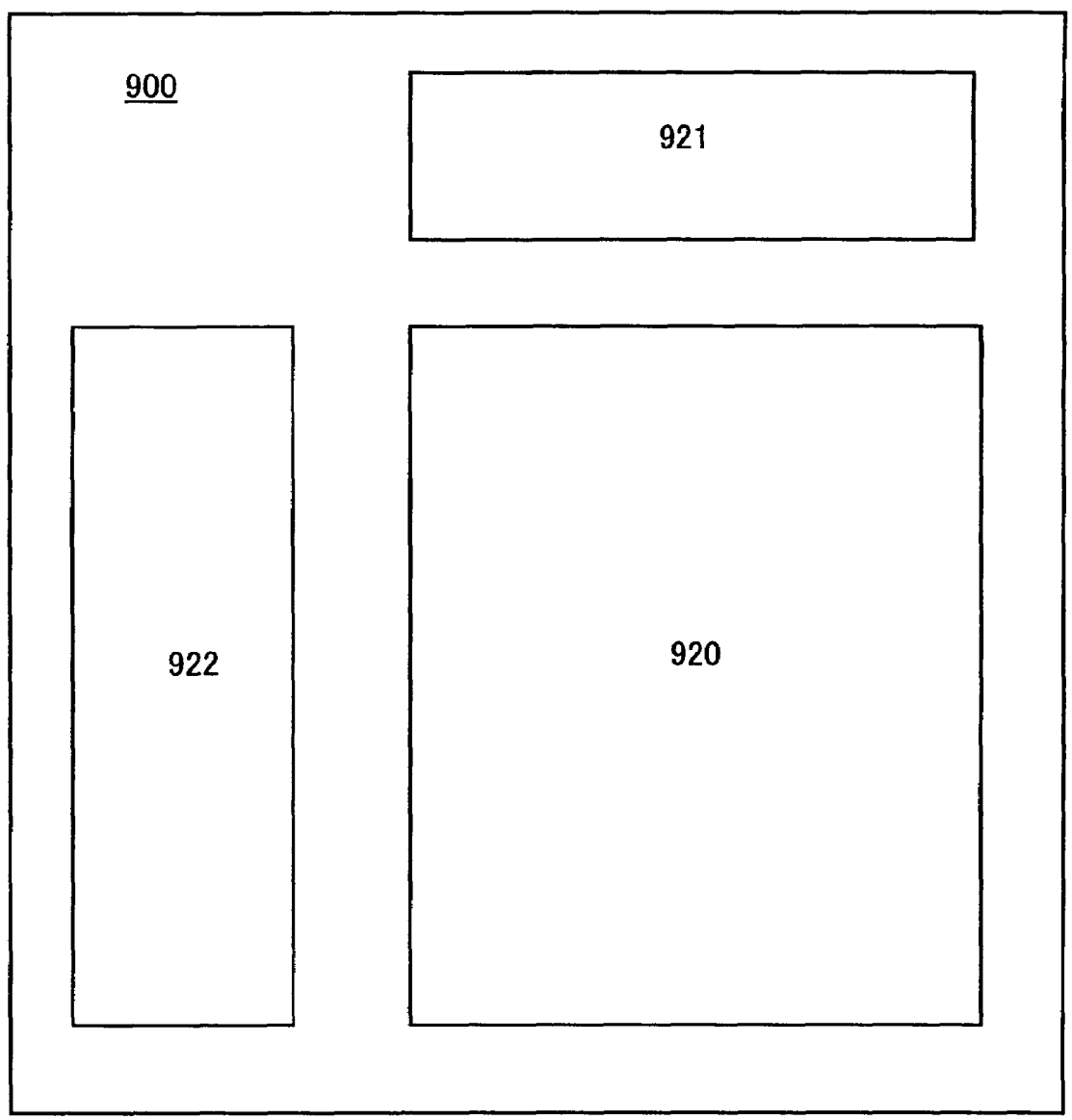
FIG. 6 is a block diagram showing a structure of a semiconductor device of the present invention.
Figure 21:
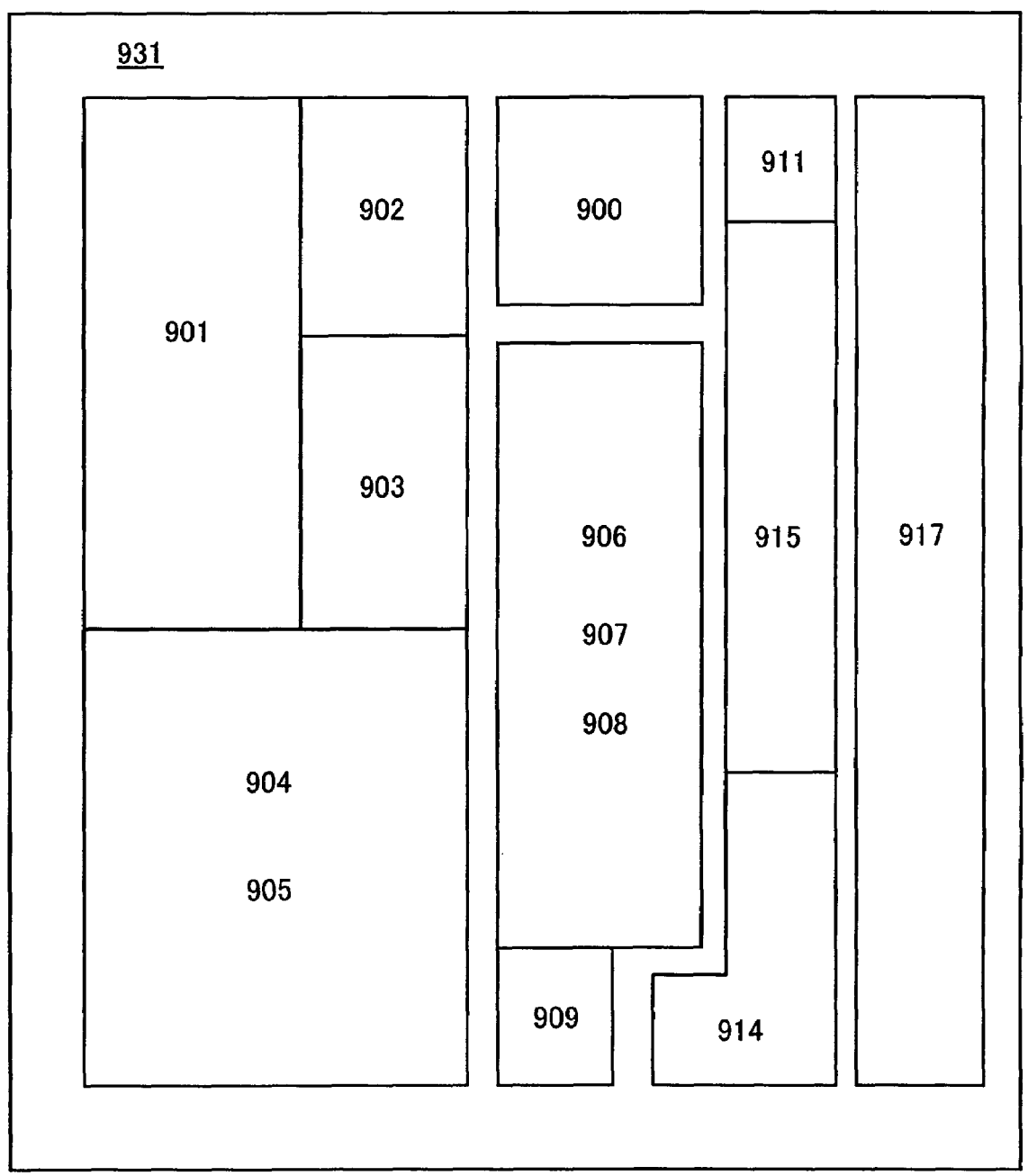
FIG. 21 is a block diagram showing a structure of a semiconductor device of the present invention.

Embodiment 1 will describe a structure and operation of a semiconductor device capable of wireless communication with the use of an IC, which is formed using the present invention, with reference to FIG. 2, FIG. 6, and FIG. 21.

First, the structure is described. As shown in FIG. 21, a semiconductor device (also referred to as an ID chip, an IC chip, an IC tag, an ID tag, a wireless chip, or an RFID) 931 formed using the present invention includes circuit blocks of an antenna 917, a high-frequency circuit 914, a power supply circuit 915, a reset circuit 911, a rectifier circuit 906, a demodulation circuit 907, an analog amplifier 908, a clock generation circuit 903, a modulation circuit 909, a signal output control circuit 901, a CRC circuit 902, and a mask ROM 900. The power supply circuit 915 includes circuit blocks of a rectifier circuit and a storage capacitor. Further, as shown in FIG. 6, the mask ROM 900 includes a memory cell array 920, a column decoder 921, and a row decoder 922.

As the antenna 917, any of a dipole antenna, a patch antenna, a loop antenna, and a Yagi antenna can be used.

In addition, as a method for transmitting and receiving a wireless signal in the antenna 917, any of an electromagnetic coupling method, an electromagnetic induction method, and an electromagnetic wave method may be used.

The semiconductor device 931 formed using the present invention is applied to the semiconductor device 221 shown in FIG. 2.

Next, the operation of the semiconductor device 931 formed using the present invention is described. A wireless signal is transmitted from the antenna unit 222 which is electrically connected to the interrogator (also referred to as a reader/writer) 223. The wireless signal includes an instruction from the interrogator (also referred to as a reader/writer) 223 to the semiconductor device 931.

The wireless signal received by the antenna 917 is transmitted to each circuit block via the high-frequency circuit 914. The signal transmitted to the power supply circuit 915 via the high-frequency circuit 914 is input to the rectifier circuit.

Here, the rectifier circuit has an action of rectifying a polarity of the wireless signal. The signal is rectified and then smoothened by the storage capacitor. Then, a high power supply potential (VDD) is generated.

The wireless signal received by the antenna 917 is also transmitted to the rectifier circuit 906 via the high-frequency circuit 914. The signal is rectified and then demodulated by the demodulation circuit 907. The demodulated signal is amplified by the analog amplifier 908.

Further, the wireless signal received by the antenna 917 is also transmitted to the clock generation circuit 903 via the high-frequency circuit 914. The signal transmitted to the clock generation circuit 903 is frequency-divided to be a reference clock signal. Here, the reference clock signal is transmitted to each circuit block and used for latching a signal, selecting a signal, and the like.

The signal amplified by the analog amplifier 908 and the reference clock signal are transmitted to a code extraction circuit 904. In the code extraction circuit 904, an instruction transmitted from the interrogator (also referred to as a reader/writer) 223 to the semiconductor device 931 is extracted from the signal amplified by the analog amplifier 908. The code extraction circuit 904 also forms a signal for controlling a code identification circuit 905.

The instruction extracted by the code extraction circuit 904 is transmitted to the code identification circuit 905. The code identification circuit 905 identifies the instruction transmitted from the interrogator (also referred to as a reader/writer) 223. The code identification circuit 905 also has a role of controlling the CRC circuit 902, the mask ROM 900, and the signal output control circuit 901.

In this manner, the instruction transmitted from the interrogator (also referred to as a reader/writer) 223 is identified, and the CRC circuit 902, the mask ROM 900, and the signal output control circuit 901 are operated in accordance with the identified instruction. In addition, a signal including individual data such as an ID number which is stored in or written to the mask ROM 900, is output.

Here, the mask ROM 900 includes the memory cell array 920, the column decoder 921, and the row decoder 922.

The signal output control circuit 901 has a role of converting the signal including the individual data such as the ID number which is stored in or written to the mask ROM 900 into a signal encoded by an encoding method to which a standard of the ISO or the like is applied.

Last, in accordance with the encoded signal, the signal transmitted to the antenna 917 is modulated by the modulation circuit 909.

The modulated signal is received by the antenna unit 222 which is electrically connected to the interrogator (also referred to as a reader/writer) 223. Then, the received signal is analyzed by the interrogator (also referred to as a reader/writer) 223, so that the individual data such as the ID number of the semiconductor device 931 formed using the present invention can be recognized.

In a wireless communication system using the semiconductor device 931 capable of wireless communication with the use of an IC, formed using the present invention, the semiconductor device 931, an interrogator (also referred to as a reader/writer) having a known structure, an antenna electrically connected to the interrogator (also referred to as a reader/writer), and a control terminal for controlling the interrogator (also referred to as a reader/writer) can be used. A communication method of the semiconductor device 931 and the antenna electrically connected to the interrogator (also referred to as a reader/writer) is a one-way communication or two-way communication, and any of a space division multiplexing method, a polarization division multiplexing method, a frequency-division multiplexing method, a time-division multiplexing method, a code division multiplexing method, and an orthogonal frequency division multiplexing method can also be used.

The wireless signal is a signal in which a carrier wave is modulated. Modulation of a carrier wave is an analog modulation or a digital modulation, which may be any of an amplitude modulation, a phase modulation, a frequency modulation, and spread spectrum.

As for a frequency of a carrier wave, any of the following can be employed: a submillimeter wave of greater than or equal to 300 GHz and less than or equal to 3 THz; an extra high frequency of greater than or equal to 30 GHz and less than 300 GHz; a super high frequency of greater than or equal to 3 GHz and less than 30 GHz; an ultra high frequency of greater than or equal to 300 MHz and less than 3 GHz; a very high frequency of greater than or equal to 30 MHz and less than 300 MHz; a high frequency of greater than or equal to 3

MHz and less than 30 MHz; a medium frequency of greater than or equal to 300 KHz and less than 3 MHz; a low frequency of greater than or equal to 30 KHz and less than 300 KHz; and a very low frequency of greater than or equal to 3 KHz and less than 30 KHz.

This embodiment can be implemented with a combination of any description of the embodiment modes or other embodiments if needed.

Embodiment 2

Embodiment 2 will describe examples in which an external antenna is provided for a semiconductor device formed using the present invention, with reference to FIGS. 22A to 22E.

Figure 22A:
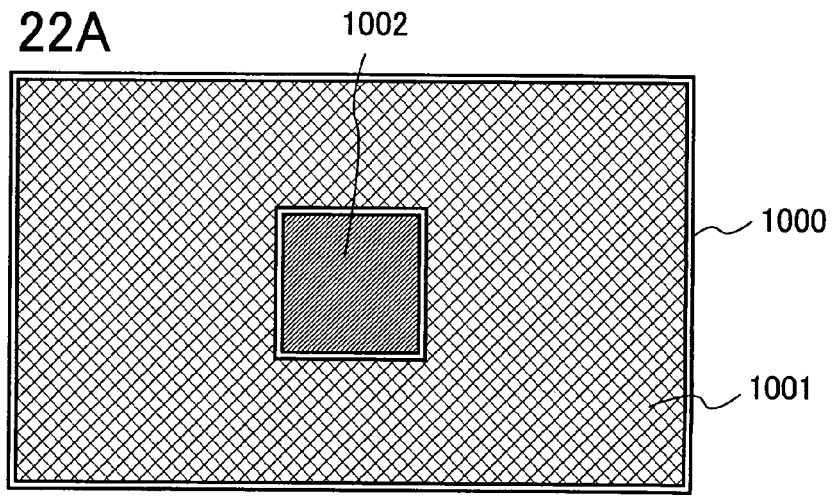
FIGS. 22A to 22E are top views of semiconductor devices of the present invention.

FIG. 22A shows a case where a sheet of antenna covers the periphery of a semiconductor device. An antenna 1001 is formed over a substrate 1000 and a semiconductor device 1002 formed using the present invention is electrically connected thereto. In FIG. 22A, the antenna 1001 covers the periphery of the semiconductor device 1002, however, the antenna 1001 may cover the entire surface of the substrate and the semiconductor device 1002 having electrodes may be attached thereto.

Figure 22B:
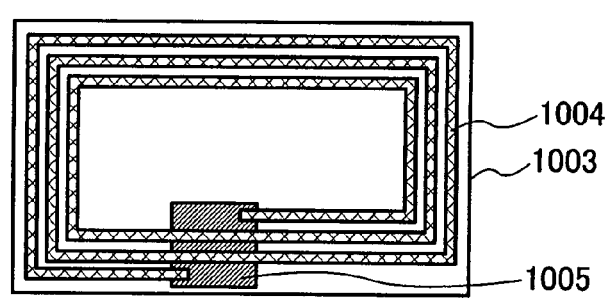

FIG. 22B shows an example of a coil antenna in which an antenna is arranged to circle around a semiconductor device. An antenna 1004 is formed over a substrate 1003 and a semiconductor device 1005 formed using the present invention is connected thereto. It is to be noted that the arrangement of the antenna is only an example and the invention is not limited to this.

Figure 22C:
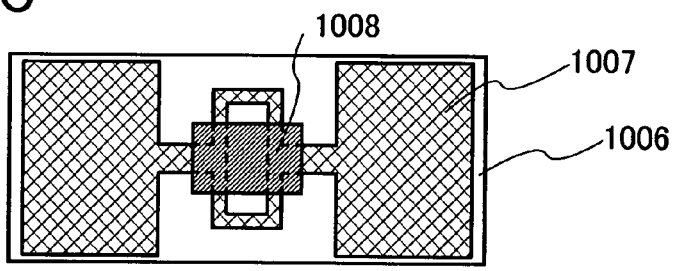

FIG. 22C shows an antenna for high frequency. An antenna 1007 is formed over a substrate 1006 and a semiconductor device 1008 formed using the present invention is electrically connected thereto.

Figure 22D:
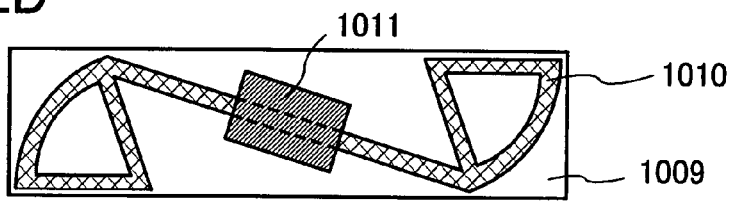

FIG. 22D shows a 180° omni-directional antenna (capable of receiving signals equally from any directions). An antenna 1010 is formed over a substrate 1009 and a semiconductor device 1011 formed using the present invention is electrically connected thereto.

Figure 22E:
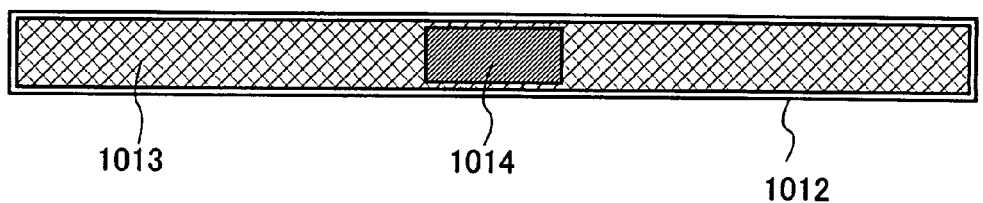

FIG. 22E shows an antenna extended in a stick shape. An antenna 1013 is formed over a substrate 1012 and a semiconductor device 1014 formed using the present invention is electrically connected thereto.

Figure 24A:
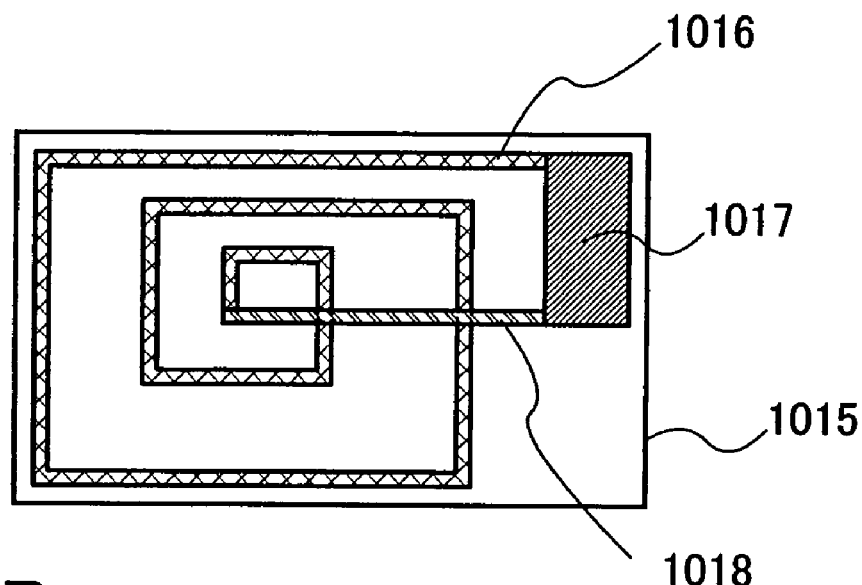
FIGS. 24A and 24B are top views of semiconductor devices of the present invention.

Further, FIG. 24A shows another example of a coil antenna. An antenna 1016 is formed over a substrate 1015, and a semiconductor device 1017 formed using the present invention is electrically connected thereto. One end portion of the antenna 1016 is connected to the semiconductor device 1017. The other end portion of the antenna 1016 is connected to a wiring 1018 which is formed in a different process from that of the antenna 1016, and is electrically connected to the semiconductor device 1017 through the wiring 1018. In FIG. 24A, a part of the wiring 1018 is formed over the antenna 1016; however, it may be formed below the antenna 1016.

Figure 24B:
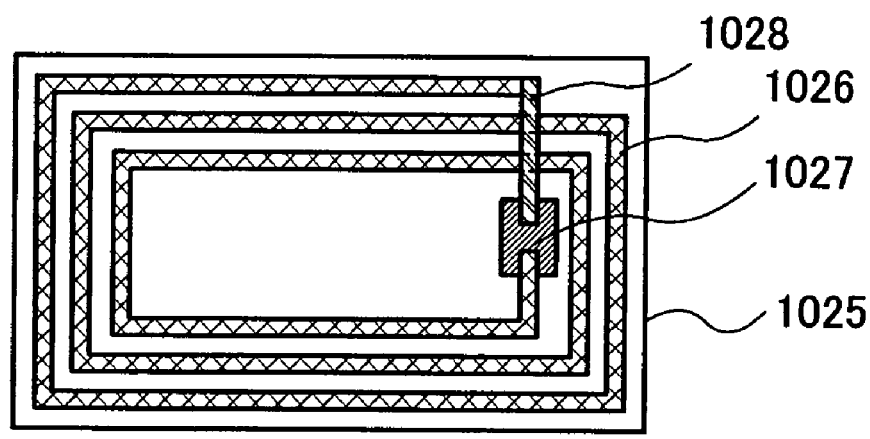

FIG. 24B shows another example of a coil antenna. An antenna 1026 is formed over a substrate 1025, and a semiconductor device 1027 formed using the present invention is electrically connected thereto. One end portion of the antenna 1026 is connected to the semiconductor device 1027. The other end portion of the antenna 1026 is connected to a wiring 1028 which is formed in a different process from that of the antenna 1026, and is electrically connected to the semiconductor device 1027 through the wiring 1028. In FIG. 24B, a part of the wiring 1028 is formed over the antenna 1026; however, it may be formed below the antenna 1026.

A semiconductor device formed using the present invention and the above-described antenna can be connected by a known method. For example, the antenna and the semiconductor device are connected by wire bonding or bump bonding. Alternatively, a circuit chip having an electrode on an entire surface thereof may be attached to the antenna; in this method, an ACF (anisotropic conductive film) can be used for the attachment.

An appropriate length of the antenna varies depending on a frequency for receiving signals. For example, when the frequency is 2.45 GHz, in the case of providing a half-wave dipole antenna, the length of the antenna may be a half wavelength (about 60 mm), and in the case of providing a monopole antenna, the length may be a quarter wavelength (about 30 mm).

It is to be noted that the example shown in this embodiment is only an example and the shape of the antenna is not limited. The present invention can be implemented with any shape of the antenna. This embodiment can be implemented by using any combination with the above embodiment modes and the other embodiments.

According to the present invention, a semiconductor device capable of communication via wireless communication, in which individual data such as an ID number can be easily formed, can be manufactured.

Since a current density of a contact portion of a source region can be set equal to a current density of a contact portion of a drain region in a TFT of a ROM in a semiconductor device, heating of either one of the source region and the drain region can be prevented. Accordingly, a semiconductor device capable of wireless communication, including a TFT of a ROM with improved reliability can be manufactured.

This application is based on Japanese Patent Application serial no. 2006-181374 filed in Japan Patent Office on Jun. 30, 2006, the entire contents of which are hereby incorporated by reference.

What is claimed is:

1. A semiconductor device comprising:
   a thin film transistor over a substrate including an island-like semiconductor film having a channel forming region, a source region, and a drain region, wherein a gate insulating film is formed adjacent to the island-like semiconductor film, and a gate electrode is formed adjacent to the island-like semiconductor film;
   an interlayer insulating film over the thin film transistor;
   a plurality of first contact holes formed in the interlayer insulating film, wherein a base of each of the plurality of first contact holes has a first diameter and is in direct contact with one of the source region and the drain region; and
   a second contact hole formed in the interlayer insulating film, wherein a base of the second contact hole has a second diameter and is in direct contact with the other one of the source region and the drain region,
   wherein the second diameter is larger than the first diameter.

2. The semiconductor device according to claim 1, wherein the thin film transistor is used in a nonvolatile memory circuit.

3. The semiconductor device according to claim 1, further comprising:
   a side wall adjacent to a side surface of the gate electrode.

4. A semiconductor device comprising:
   a first thin film transistor over a substrate including a first island-like semiconductor film including a first channel forming region, a first source region, and a first drain region, wherein a gate insulating film is formed adjacent to the first island-like semiconductor film, and a first gate electrode is formed adjacent to the first island-like semiconductor film;

a second thin film transistor over the substrate including a second island-like semiconductor film including a second channel forming region, a second source region, and a second drain region, wherein the gate insulating film is formed adjacent to the second island-like semiconductor film, and a second gate electrode is formed adjacent to the second island-like semiconductor film;

an interlayer insulating film over the first thin film transistor and the second thin film transistor;

a plurality of first contact holes formed in the interlayer insulating film, wherein a base of each of the plurality of first contact holes has a first diameter and is in direct contact with one of the first source region and the first drain region;

a plurality of second contact holes formed in the interlayer insulating film, wherein a base of each of the plurality of second contact holes has a second diameter and is in direct contact with one of the second source region and the second drain region; and a third contact hole formed in the interlayer insulating film, wherein a base of the third contact hole has a third diameter and is in direct contact with either the other of the first source region and the first drain region or the other of the second source region and the second drain region, wherein the third diameter is larger than the first and second diameters.

5. The semiconductor device according to claim 4, wherein the first thin film transistor and the second thin film transistor are used in a nonvolatile memory circuit.

6. The semiconductor device according to claim 4, further comprising:
a first side wall adjacent to a side surface of the first gate electrode; and
a second side wall adjacent to a side surface of the second gate electrode.

7. A semiconductor device comprising:
a first thin film transistor over a substrate including a first island-like semiconductor film including a first channel forming region, a first source region, and a first drain region, wherein a first gate insulating film is formed adjacent to the first island-like semiconductor film, and a first gate electrode is formed adjacent to the first island-like semiconductor film;

a second thin film transistor over the substrate including a second island-like semiconductor film including a second channel forming region, a second source region, and a second drain region, a second gate insulating film is formed adjacent to the second island-like semiconductor film, and a second gate electrode is formed adjacent to the second island-like semiconductor film;

an interlayer insulating film over the first thin film transistor and the second thin film transistor;

a first contact hole formed in the interlayer insulating film and in contact with one of the first source region and the first drain region;

a second contact hole formed in the interlayer insulating film and in contact with the other of the first source region and the first drain region;

a plurality of third contact holes formed in the interlayer insulating film, wherein a base of each of the plurality of third contact holes has a third diameter and is in direct contact with one of the second source region and the second drain region; and a fourth contact hole formed in the interlayer insulating film, wherein a base of the fourth contact hole has a fourth diameter and is in direct contact with the other of the second source region and the second drain region, wherein the fourth diameter is larger than the third diameter.

8. The semiconductor device according to claim 7, wherein the second thin film transistor is used in a nonvolatile memory circuit, and the first thin film transistor is used in a logic circuit for controlling the nonvolatile memory circuit.

9. The semiconductor device according to claim 7, further comprising:
a first side wall adjacent to a side surface of the first gate electrode; and
a second side wall adjacent to a side surface of the second gate electrode.

* * * * *